(12) United States Patent
Lin et al.

(10) Patent No.: US 11,217,679 B2
(45) Date of Patent: Jan. 4, 2022

(54) SEMICONDUCTOR DEVICE AND METHOD

(71) Applicant: Taiwan Semiconductor Manufacturing Company, Ltd., Hsinchu (TW)

(72) Inventors: Chien-Chih Lin, Taichung (TW); Yen-Ting Chen, Taichung (TW); Wen-Kai Lin, Yilan County (TW); Szu-Chi Yang, Hsinchu (TW); Shih-Hao Lin, Hsinchu (TW); Tsung-Hung Lee, Hsinchu (TW); Ming-Lung Cheng, Qieding Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/837,554

(22) Filed: Apr. 1, 2020

(65) Prior Publication Data
US 2021/0313441 A1  Oct. 7, 2021

(51) Int. Cl.
| | | |
|---|---|---|
| H01L 29/66 | (2006.01) | |
| H01L 29/78 | (2006.01) | |
| H01L 29/06 | (2006.01) | |
| H01L 27/092 | (2006.01) | |
| H01L 21/02 | (2006.01) | |
| H01L 21/8238 | (2006.01) | |

(52) U.S. Cl.
CPC .... *H01L 29/6656* (2013.01); *H01L 21/02126* (2013.01); *H01L 21/02211* (2013.01); *H01L 21/02271* (2013.01); *H01L 21/02318* (2013.01); *H01L 21/823821* (2013.01); *H01L 27/0924* (2013.01); *H01L 29/0653* (2013.01); *H01L 29/66795* (2013.01); *H01L 29/785* (2013.01)

(58) Field of Classification Search
CPC ......... H01L 29/6656; H01L 21/823468; H01L 29/66553; H01L 21/823864; H01L 29/511–513; H01L 27/0924; H01L 21/823821; H01L 29/785; H01L 29/66795; H01L 21/02126
See application file for complete search history.

(56) References Cited

U.S. PATENT DOCUMENTS

| | | |
|---|---|---|
| 9,419,101 B1 | 8/2016 | Peng et al. |
| 9,647,116 B1 | 5/2017 | Lee et al. |
| 10,748,760 B2 | 8/2020 | Liao et al. |
| 2016/0372567 A1 | 12/2016 | Tak et al. |
| 2019/0027579 A1 | 1/2019 | Tsai et al. |
| 2019/0287797 A1 | 9/2019 | Tak et al. |
| 2020/0035804 A1 | 1/2020 | Chen et al. |
| 2020/0091345 A1 | 3/2020 | Chiu et al. |

FOREIGN PATENT DOCUMENTS

| | | |
|---|---|---|
| DE | 102016115751 A1 | 5/2017 |
| DE | 102018124675 A1 | 6/2019 |

*Primary Examiner* — Amar Movva
(74) *Attorney, Agent, or Firm* — Slater Matsil, LLP

(57) ABSTRACT

In an embodiment, a structure includes: a semiconductor substrate; a fin extending from the semiconductor substrate; a gate stack over the fin; an epitaxial source/drain region in the fin adjacent the gate stack; and a gate spacer disposed between the epitaxial source/drain region and the gate stack, the gate spacer including a plurality of silicon oxycarbonitride layers, each of the plurality of silicon oxycarbonitride layers having a different concentration of silicon, a different concentration of oxygen, a different concentration of carbon, and a different concentration of nitrogen.

20 Claims, 21 Drawing Sheets

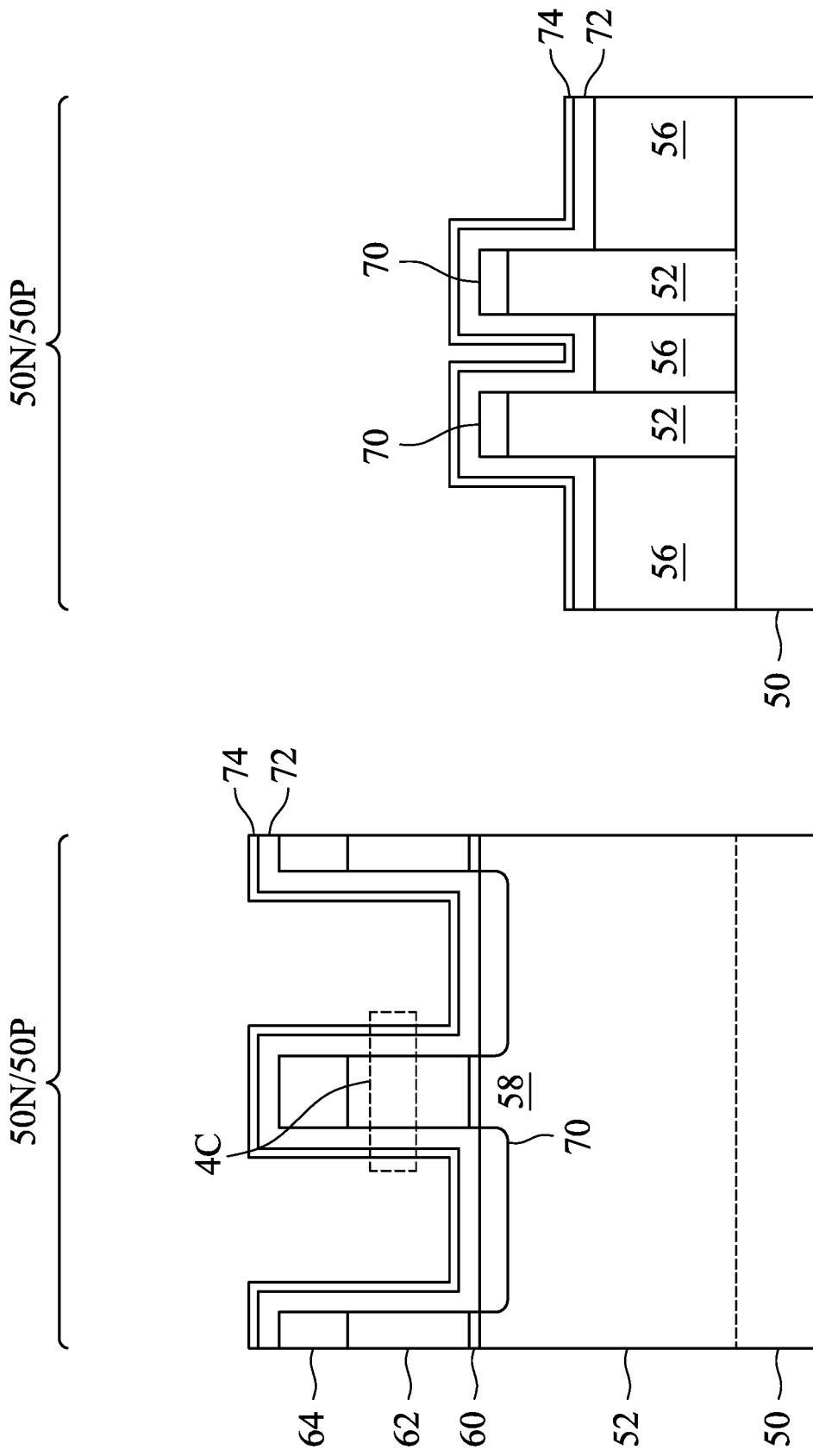

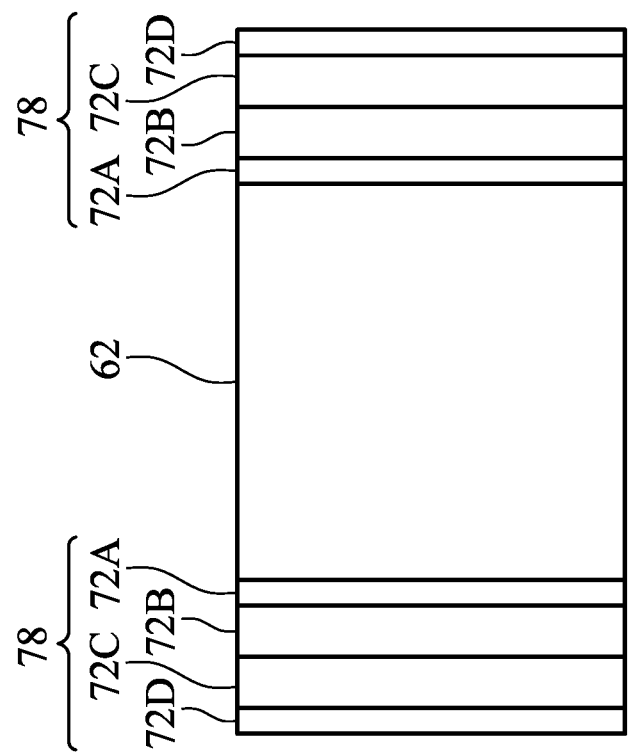

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
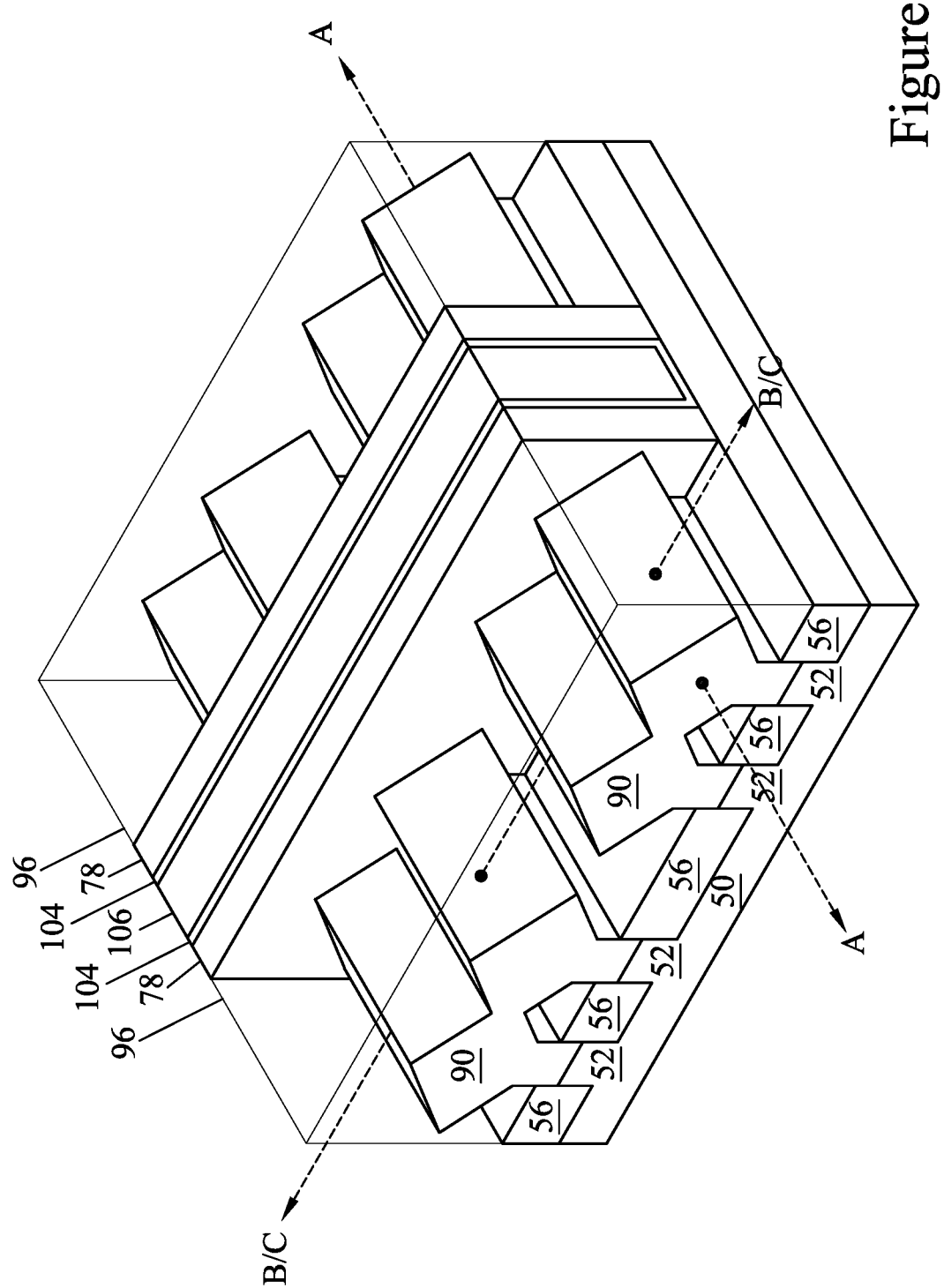
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, transistors with multi-layered gate spacers are formed. The gate spacer layers each comprise a different composition of silicon oxycarbonitride. Some of the gate spacer layers are formed with compositions of silicon oxycarbonitride that allow the gate spacer layers to have a high etch selectivity, relative to subsequent etching processes that are used to form the transistors. Loss of the gate spacer layers may thus be reduced, thus decreasing the relative permittivity of the gate spacers. The parasitic capacitance of the resulting FinFETs may thus be decreased.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring STI regions 56.

Gate dielectrics 104 are along sidewalls and over top surfaces of the fins 52, and gate electrodes 106 are over the gate dielectrics 104. Source/drain regions 90 are disposed in opposite sides of the fin 52 with respect to the gate dielectrics 104 and gate electrodes 106. Gate spacers 78 separate the source/drain regions 90 from the gate dielectrics 104 and gate electrodes 106. An inter-layer dielectric (ILD) layer 96 is disposed over the source/drain regions 90 and STI regions 56. In embodiments where multiple transistors are formed, the source/drain regions 90 may be shared between various transistors. In embodiments where one transistor is formed from multiple fins 52, neighboring source/drain regions 90 may be electrically connected, such as through coalescing the source/drain regions 90 by epitaxial growth, or through coupling the source/drain regions 90 with a same source/drain contact.

FIG. 1 further illustrates several reference cross-sections. Cross-section A-A is along a longitudinal axis of the fin 52 and in a direction of, for example, a current flow between the source/drain regions 90 of a FinFET. Cross-section B/C-B/C is perpendicular to cross-section A-A and extends through source/drain regions 90 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
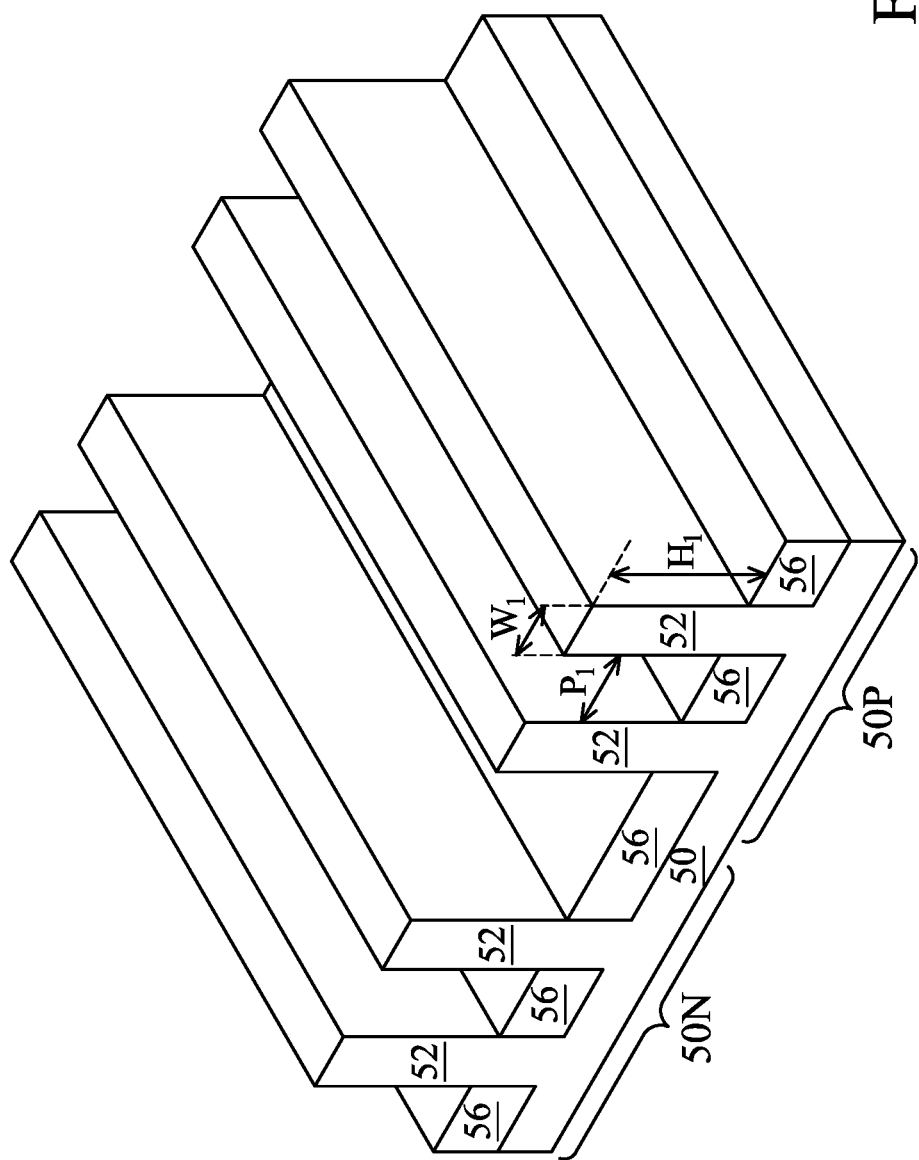
FIGS. 2 and 3 are three-dimensional views of intermediate stages in the manufacturing of FinFETs, in accordance with some embodiments.
Figure 3:
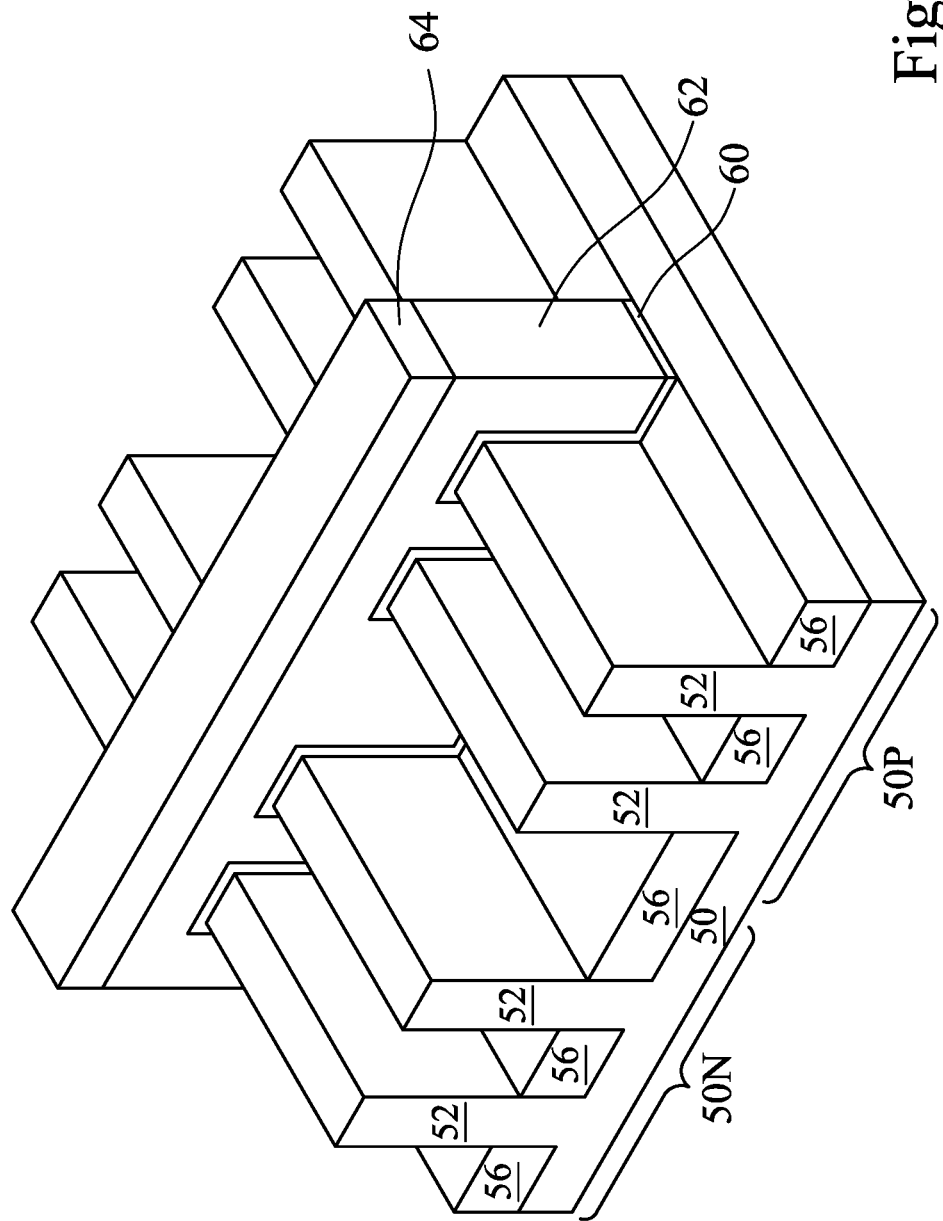

FIGS. 2 through 15B are various views of intermediate stages in the manufacturing of FinFETs, in accordance with some embodiments. FIGS. 2 and 3 are three-dimensional views. FIGS. 4A, 5A, 6A, 7A, 8A, 9A, 10A, 11A, 12A, 13A, 14A, and 15A are cross-sectional views illustrated along reference cross-section A-A in FIG. 1, except for multiple fins/FinFETs. FIGS. 4B, 5B, 6B, 6C, 7B, 8B, 9B, 10B, 11B, 12B, 13B, 14B, and 15B are cross-sectional views illustrated along reference cross-section B/C-B/C in FIG. 1, except for multiple fins/FinFETs.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 50 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 have a width $W_1$, and fins 52 in a same region 50N/50P are spaced apart by a pitch $P_1$. The width $W_1$ can be in the range of about 3 nm to about 30 nm. The pitch $P_1$ can be in the range of about 20 nm to about 100 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend a height $H_1$ above top surfaces of the STI regions 56. The height $H_1$ can be greater than about 40 nm, such as in the range of about 50 nm to about 80 nm. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 60 are formed over the fins 52 and dummy gates 62 are formed over the dummy gate dielectrics 60. The dummy gate dielectrics 60 and dummy gates 62 may be collectively referred to as "dummy gate stacks," with each dummy gate stack including a dummy gate dielectric 60 and a dummy gate 62. The dummy gate stacks extend along sidewalls and top surfaces of the fins 52. Although only one dummy gate stack is illustrated, it should be appreciated that multiple dummy gate stack are simultaneously formed, and each fin 52 may have multiple dummy gate stacks formed thereon.

As an example of forming the dummy gate dielectrics 60 and dummy gates 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the region 50N and the region 50P. It is noted that the dummy dielectric layer is shown covering only the fins 52 for illustrative purposes only. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form dummy gates 62. The pattern of the masks 64 is further transferred to the dummy dielectric layer to form dummy gate dielectrics 60. The dummy gates 62 cover respective channel regions 58 of the fins 52. The pattern of the masks 64 may be used to physically separate each of the dummy gates 62 from adjacent dummy gates. The dummy gates 62 may also have a lengthwise direction substantially perpendicular to the lengthwise direction of respective fins 52.

In FIGS. 4A and 4B, lightly doped source/drain (LDD) regions 70 are formed in the fins 52. The LDD regions 70 may be formed by, e.g., implantation. In the embodiments with different device types, similar to the implants discussed above, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{19}$ $cm^{-3}$. An anneal may be used to repair implant damage and to activate the implanted impurities.

A plurality of gate spacer layers 72 are formed. Another spacer layer 74 is then formed over the gate spacer layers 72. The spacer layer 74 and each of the gate spacer layers 72 is formed of a dielectric material such as silicon nitride, silicon carbonitride, silicon oxycarbonitride, silicon oxycarbide, silicon, metal oxides, the like, or a combination thereof, and may be formed by a conformal deposition process such as chemical vapor deposition (CVD), plasma enhanced chemical vapor deposition (PECVD), atomic layer deposition (ALD), or the like. As discussed further below, some of the gate spacer layers 72 have a high etch selectivity with the dummy gate dielectrics 60 and the spacer layer 74.

Figure 4C:
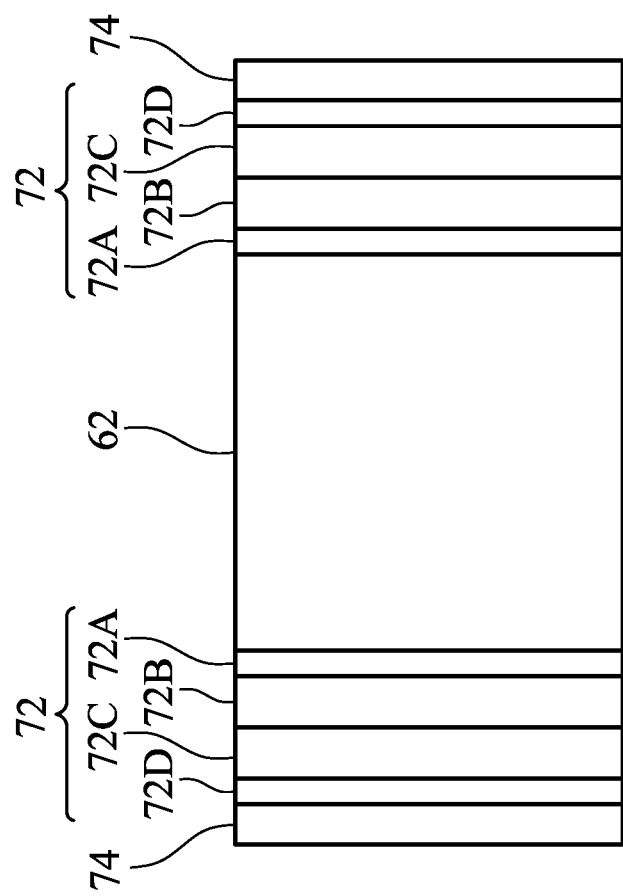
FIGS. 4A through 15B are cross-sectional views of further intermediate stages in the manufacturing of FinFETs, in accordance with some embodiments.

FIG. 4C is a detailed view of a region 4C of FIG. 4A, showing more details of the gate spacer layers 72, and is described concurrently with FIGS. 4A and 4B. The gate spacer layers 72 include a first protective layer 72A, a first main layer 72B, a second main layer 72C, and a second protective layer 72D. In some embodiments, each of the gate spacer layers 72A, 72B, 72C, and 72D is a silicon oxycarbonitride layer having a different composition of silicon, oxygen, carbon, and nitrogen. In other words, each of the gate spacer layers 72 is a dielectric layer comprising a different composition of the same four elements. Forming the gate spacer layers 72 with different compositions of silicon oxycarbonitride allows the gate spacer layers 72 to avoid damage during subsequent etching processes, and also allows some of the gate spacer layers 72 to have a low k-value. The gate spacer layers 72 can be formed to combined thickness in the range of about 10 Å to about 100 Å.

The first protective layer 72A is deposited on sidewalls and top surfaces of the fins 52 and dummy gates 62. In some embodiments, the first protective layer 72A is formed of silicon oxycarbonitride having a composition of from about 20 atomic percent (at. %) to about 40 at. % silicon, of from about 20 at. % to about 50 at. % oxygen, of less than about 20 at. % carbon, and of from about 10 at. % to about 30 at. % nitrogen. The first protective layer 72A can be deposited using dielectric material precursors comprising a silicon source precursor (e.g., hexachlorodisilane ($Si_2Cl_6$, HCD)), an oxygen source precursor (e.g., dioxygen ($O_2$)), a carbon source precursor (e.g., propylene ($C_3H_6$)), and a nitrogen source precursor (e.g., ammonia ($NH_3$)). In embodiments where the deposition is by CVD, the composition of the first protective layer 72A can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 500 sccm to about 8000 sccm, the carbon source precursor can be dispensed at a rate in the range of about 100 sccm to about 3000 sccm, and the nitrogen source precursor can be dispensed at a rate in the range of about 1000 sccm to about 5000 sccm. The first protective layer 72A can be deposited at a temperature in the range of about 550° C. to about 650° C. After deposition, the first protective layer 72A has a density in the range of about 2.3 $g/cm^3$ to about 2.6 $g/cm^3$, a refractive index (RI) in the range of about 1.65 to about 1.8, and a k-value in the range of about 4.5 to about 6. The first protective layer 72A has a small thickness, such as a thickness in the range of about 1 Å to about 20 Å.

The first main layer 72B is deposited on the first protective layer 72A. In some embodiments, the first main layer 72B is formed of silicon oxycarbonitride having a composition of from about 20 at. % to about 40 at. % silicon, of from about 20 at. % to about 50 at. % oxygen, of less than about 20 at. % carbon, and of from about 10 at. % to about 30 at. % nitrogen. The first main layer 72B can be deposited using dielectric material precursors comprising a silicon source precursor (e.g., hexachlorodisilane ($Si_2Cl_6$, HCD)), an oxygen source precursor (e.g., dioxygen ($O_2$)), a carbon source precursor (e.g., propylene ($C_3H_6$)), and a nitrogen source precursor (e.g., ammonia ($NH_3$)). In embodiments where the deposition is by CVD, the composition of the first main layer 72B can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 500 sccm to about 8000 sccm, the carbon source precursor can be dispensed at a rate in the range of about 100 sccm to about 3000 sccm, and the nitrogen source precursor can be dispensed at a rate in the range of about 1000 sccm to about 5000 sccm. The first main layer 72B can be deposited at a temperature in the range of about 550° C. to about 650° C. After deposition, the first main layer 72B has a density in the range of about 2.3 $g/cm^3$ to about 2.6 $g/cm^3$, a refractive index (RI) in the range of about 1.65 to about 1.8, and a k-value in the range of about 4.5 to about 6. The first main layer 72B has a large thickness, such as a thickness in the range of about 10 Å to about 50 Å.

The second main layer 72C is deposited on the first main layer 72B. In some embodiments, the second main layer 72C is formed of silicon oxycarbonitride having a composition of from about 20 at. % to about 40 at. % silicon, of from about 20 at. % to about 70 at. % oxygen, of less than about 20 at. % carbon, and of less than about 20 at. % nitrogen. The second main layer 72C can be deposited using dielectric material precursors comprising a silicon source precursor (e.g., hexachlorodisilane ($Si_2Cl_6$, HCD)), an oxygen source precursor (e.g., dioxygen ($O_2$)), and a carbon-nitrogen source precursor (e.g., triethylamine ($N(C_2H_5)_3$)). In embodiments where the deposition is by CVD, the composition of the second main layer 72C can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 500 sccm to about 8000 sccm, and the carbon-nitrogen source precursor can be dispensed at a rate in the range of about 500 sccm to about 3000 sccm. The second main layer 72C can be deposited at a temperature in the range of about 550° C. to about 650° C. In some embodiments, an anneal is performed after deposition of the second main layer 72C. The anneal process can be performed at a temperature in the range of about 600° C. to about 750° C., for a duration in the range of about 30 minutes to about 180 minutes, and in an environment containing, e.g., oxygen. After deposition, the second main layer 72C has a density in the range of about 2 $g/cm^3$ to about 2.4 $g/cm^3$, a refractive index (RI) in the range of about 1.55 to about 1.6, and a k-value in the range of about 4 to about 5. The second main layer 72C has a large thickness, such as a thickness in the range of about 10 Å to about 50 Å.

The second protective layer 72D is deposited on the second main layer 72C. In some embodiments, the second protective layer 72D is formed of silicon oxycarbonitride having a composition of from about 20 at. % to about 40 at. % silicon, of from about 20 at. % to about 40 at. % oxygen, of from about 20 at. % to about 40 at. % carbon, and of less than about 20 at. % nitrogen. The second protective layer 72D can be deposited using dielectric material precursors comprising a silicon source precursor (e.g., hexachlorodisilane ($Si_2Cl_6$, HCD)), an oxygen source precursor (e.g., dioxygen ($O_2$)), and a carbon-nitrogen source precursor (e.g., triethylamine ($N(C_2H_5)_3$)). In embodiments where the deposition is by CVD, the composition of the second protective layer 72D can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 500 sccm to about 8000 sccm, and the carbon-nitrogen source precursor can be dispensed at a rate in the range of about 500 sccm to about 3000 sccm. The second protective layer 72D can be deposited at a temperature in the range of about 550° C. to about 650° C. In some embodiments, an anneal is performed after deposition of the second protective layer 72D. The anneal process can be performed at a temperature in the range of about 600° C. to about 750° C., for a duration in the range of about 30 minutes to about 180 minutes, and in an environment containing, e.g., oxygen. In some embodiments, a single anneal process is performed for both the second protective layer 72D and the second main layer 72C. After deposition, the second protective layer 72D has a density in the range of about 2 $g/cm^3$ to about 2.4 $g/cm^3$, a refractive index (RI) in the range of about 1.65 to about 1.75, and a k-value in the range of about 4.5 to about 6. The second protective layer 72D has a small thickness, such as a thickness in the range of about 10 Å to about 50 Å.

The gate spacer layers 72 have different compositions. Specifically, each of the gate spacer layers 72 has a different concentration of silicon, a different concentration of oxygen, a different concentration of carbon, and a different concentration of nitrogen. The first protective layer 72A and second protective layer 72D can have greater concentrations (e.g., by at. %) carbon and nitrogen than the first main layer 72B and second main layer 72C. For example, the first protective layer 72A and the second protective layer 72D can each have a concentration of carbon that is from about 1.5 to about 30 times greater than each of the first main layer 72B and second main layer 72C. Likewise, the first protective layer 72A and the second protective layer 72D can each have a concentration of nitrogen that is from about 1.1 to about 4 times greater than each of the first main layer 72B and second main layer 72C. Forming the first protective layer 72A and second protective layer 72D to be both carbon-rich and nitrogen-rich allows the first protective layer 72A and second protective layer 72D to be selective to subsequent etching processes. In some embodiments, the second protective layer 72D has a greater concentration (e.g., by at. %) carbon than the first protective layer 72A, first main layer 72B, and second main layer 72C. As discussed below, forming the second protective layer 72D with additional carbon allows the second protective layer 72D to have a high etch selectivity with the spacer layer 74, relative an etching process that will be used to pattern the spacer layer 74 in a source/drain recessing process (see FIGS. 5A and 5B). The amount of etching loss of the second protective layer 72D during processing may thus be reduced. In some embodiments, the first protective layer 72A has a greater concentration (e.g., by at. %) nitrogen than the first main layer 72B, second main layer 72C, and second protective layer 72D. As discussed below, forming the first protective layer 72A with additional nitrogen allows the first protective layer 72A to have a high etch selectivity with the dummy gate dielectrics 60, relative an etching process that will be used to remove the dummy gate dielectrics 60 in a replacement gate process (see FIGS. 10A and 10B). The amount of etching loss of the first protective layer 72A during processing may thus be reduced. In some embodiments, the second main layer 72C has a greater concentration (e.g., by at. %) oxygen than the first protective layer 72A, first main layer 72B, and second protective layer 72D. For example, the second main layer 72C can have a concentration of oxygen that is from about 1.2 to about 3 times greater than each of the first protective layer 72A, first main layer 72B, and second protective layer 72D. As discussed below, forming the second main layer 72C with a large amount of oxygen allows a gate spacer layer with a very low k-value to be formed. For example, the second main layer 72C can have a relative permittivity that is from about 10% to about 40% less than each of the first protective layer 72A, first main layer 72B, and second protective layer 72D. Reducing the etching losses and decreasing the k-values of the gate spacer layers 72 helps decrease the overall relative permittivity of the resulting gate spacers 78 (see FIGS. 5A and 5B), thus decreasing the parasitic capacitance of the resulting FinFETs. Decreasing the parasitic capacitance of the resulting FinFETs can be particularly advantageous for some application, such as ring oscillators or static random-access memory (SRAM) cells. The gate spacer layers 72 can be formed with different compositions by controlling their deposition parameters.

In some embodiments, the first protective layer 72A and first main layer 72B are formed with the same source precursors, and are formed by dispensing the source precursors at different sets of flow rates. The flow rates of each source precursor can be selected in proportion to the desired composition of the deposited layer. Specifically, the oxygen source precursor can be dispensed at a lesser rate when depositing the first protective layer 72A than when depositing the first main layer 72B, the carbon source precursor can be dispensed at a greater rate when depositing the first protective layer 72A than when depositing the first main layer 72B, and the nitrogen source precursor can be dispensed at a greater rate when depositing the first protective layer 72A than when depositing the first main layer 72B. For example, when depositing the first main layer 72B, the oxygen source precursor can be dispensed at a rate that is from about 5% to about 70% greater than that when depositing the first protective layer 72A, the carbon source precursor can be dispensed at a rate that is from about 5% to about 70% less than that when depositing the first protective layer 72A, and the nitrogen source precursor can be dispensed at a rate that is from about 5% to about 70% less than that when depositing the first protective layer 72A. In some embodiments, the first protective layer 72A and first main layer 72B are deposited in the same deposition chamber, without breaking a vacuum between deposition of the first protective layer 72A and deposition of the first main layer 72B. When the first protective layer 72A and first main layer 72B are formed in a same chamber and with the same source precursors, the boundary between the first protective layer 72A and first main layer 72B may not be an abrupt transition, but rather may be a gradient change from the material of the first protective layer 72A to the material of the first main layer 72B.

In some embodiments, the second main layer 72C and second protective layer 72D are formed with the same source precursors, and are formed by dispensing the source precursors at different sets of flow rates. The flow rates of each source precursor can be selected in proportion to the desired composition of the deposited layer. Specifically, the oxygen source precursor can be dispensed at a greater rate when depositing the second main layer 72C than when depositing the second protective layer 72D, and the carbon-nitrogen source precursor can be dispensed at a lesser rate when depositing the second main layer 72C than when depositing the second protective layer 72D. For example, when depositing the second protective layer 72D, the oxygen source precursor can be dispensed at a rate that is from about 20% to about 90% less than that when depositing the second main layer 72C, and the carbon-nitrogen source precursor can be dispensed at a rate that is from about 20% to about 90% greater than that when depositing the second main layer 72C. In some embodiments, the second main layer 72C and second protective layer 72D are deposited in the same deposition chamber, without breaking a vacuum between deposition of the second main layer 72C and deposition of the second protective layer 72D.

After formation, some or all of the gate spacer layers 72 can have different thicknesses. In some embodiments, the first main layer 72B and the second main layer 72C are each from about 1.5 to about 6 times thicker than each of the first protective layer 72A and the second protective layer 72D.

The different compositions of the gate spacer layers 72 allows the gate spacer layers 72 to have different material properties. For example, the refractive index (RI) of the second protective layer 72D can be greater than that of the first protective layer 72A, which can be greater than that of the first main layer 72B, which can be greater than that of the second main layer 72C. Likewise, the density of the first protective layer 72A can be greater than that of the first main layer 72B, which can be greater than that of the second main layer 72C, which can be greater than that of the second protective layer 72D. Finally, the k-value of the second main layer 72C can be less than that of the second protective layer 72D, which can be less than that of the first main layer 72B, which can be less than that of the first protective layer 72A. Such material properties may be advantageous for some types of gate spacers 78 (see FIGS. 5A and 5B). For example, although the first protective layer 72A and the second protective layer 72D have other advantageous properties, they also have a greater relative permittivity than the second main layer 72C. Reducing the relative permittivity of the second main layer 72C can help offset any increase in relative permittivity contributed by the first protective layer 72A and the second protective layer 72D.

Other methods may also be used to form the gate spacer layers 72. For example, some or all of the gate spacer layers 72 can be formed by ALD using the precursors described above. In such embodiments, the compositions of the gate spacer layers 72 can be controlled by adjusting the quantity of ALD cycles or the cyclic ratios of the ALD process for each of the gate spacer layers 72.

The spacer layer 74 is deposited on the second protective layer 72D. In some embodiments, the spacer layer 74 is formed of silicon nitride. The spacer layer 74 has a large thickness, such as a thickness in the range of about 1 nm to about 10 nm. The spacer layer 74 may (or may not) have a greater thickness than each of the gate spacer layers 72.

Figure 5A:
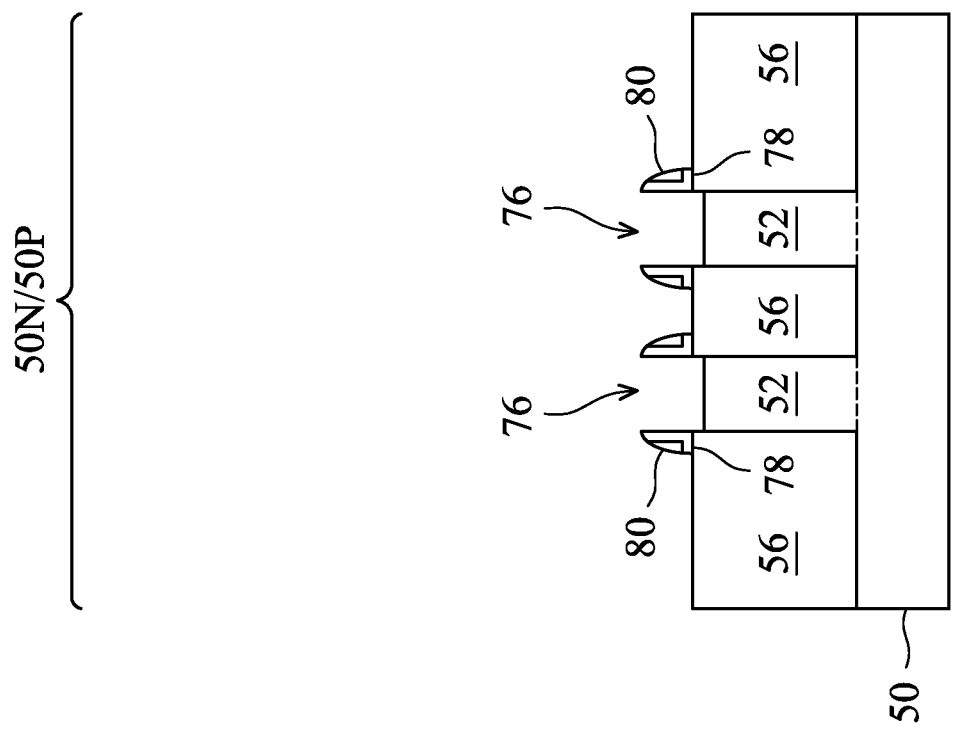
Figure 5B:
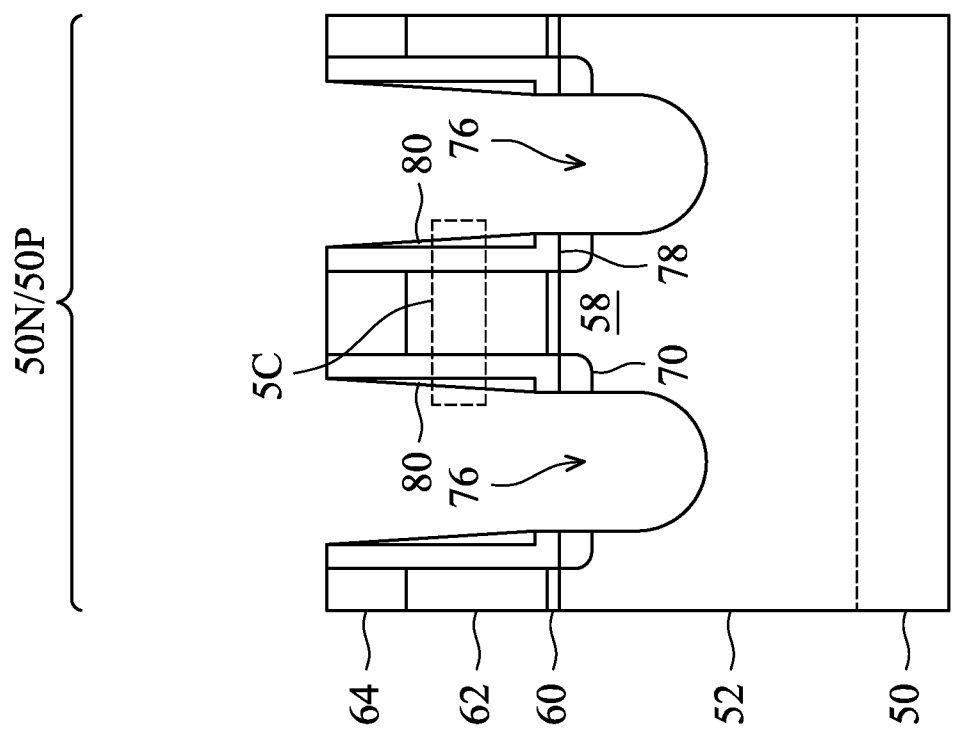
Figure 5C:
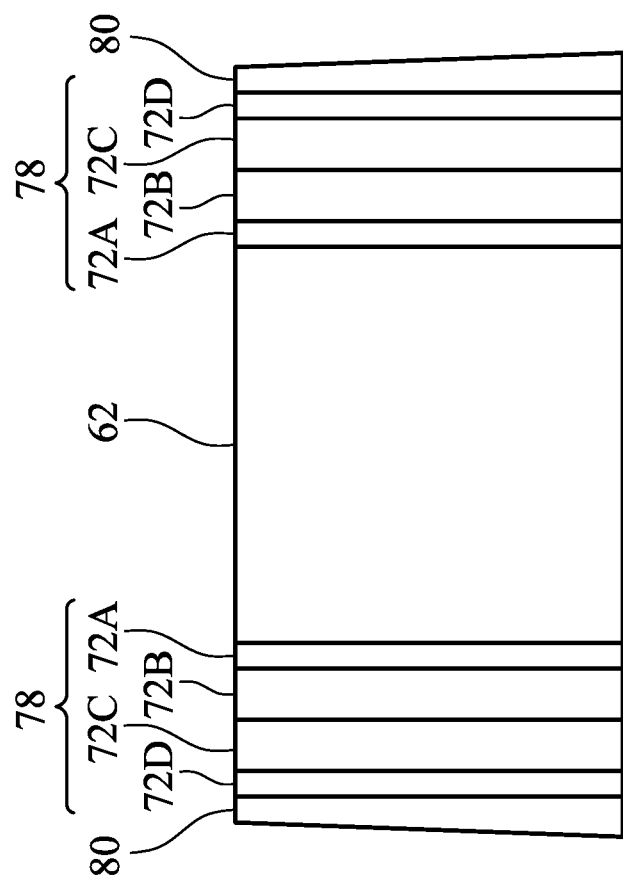

In FIGS. 5A and 5B, source/drain recesses 76 are patterned. FIG. 5C is a detailed view of a region 5C of FIG. 5A, showing more details of the gate spacers 78, and is described concurrently with FIGS. 5A and 5B. The source/drain recesses 76 are patterned through the spacer layer 74, through each of the gate spacer layers 72, and in the fins 52. The source/drain recesses 76 extend through the LDD regions 70 and may also penetrate through the fins 52. The source/drain recesses 76 can have a depth in the range of about 20 nm to about 80 nm. The source/drain recesses 76 may be formed by a suitable etching process. For example, the etching process can comprise a wet and a dry etch, thus including both isotropic and anisotropic components. In some embodiments, an anisotropic wet etch selective to the material of the spacer layer 74 can be performed to initially form openings in the spacer layer 74. For example, when the spacer layer 74 is formed of silicon nitride, the wet etch can be performed with a phosphoric acid solution ($H_3PO_4:H_2O$). The temperature of the phosphoric acid solution may be in the range of about 50° C. to about 200° C. As noted above, the second protective layer 72D has a composition that includes additional carbon. The wet etch removes the material of the spacer layer 74 at a higher rate than the carbon-rich material of the second protective layer 72D. For example, the etch rate of the spacer layer 74 is from about 1.1 to about 2 times greater than the etch rate of the second protective layer 72D relative the wet etch. In other words, the second protective layer 72D acts as an etch stop layer during the wet etch. An isotropic dry etch can then be performed to extend the openings through each of the gate spacer layers 72 and form the source/drain recesses 76 in the fins 52. For example, the dry etch can be performed with an etching gas solution that includes a mixture of tetrafluoromethane ($CF_4$) and hydrogen ($H_2$), while a plasma is generated. The dry etch may damage the spacer layer 74, which protects the underlying gate spacer layers 72. The etching process forms gate spacers 78, which comprise remaining portions of the gate spacer layers 72, and also forms second spacers 80, which comprise remaining portions of the damaged spacer layer 74.

Figure 6B:
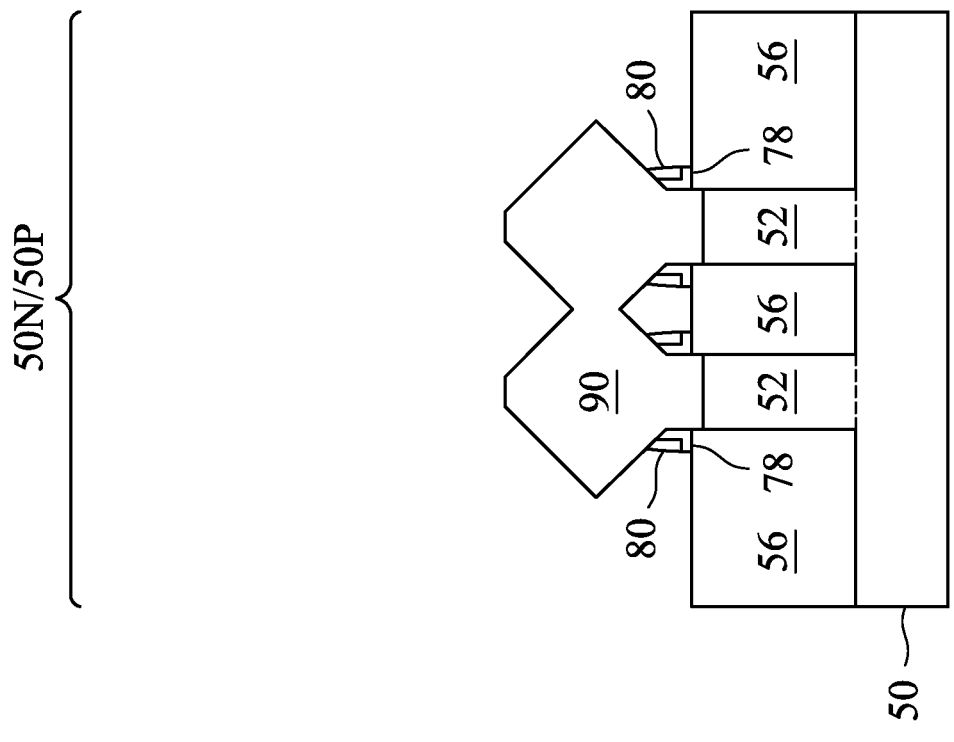
Figure 6A:
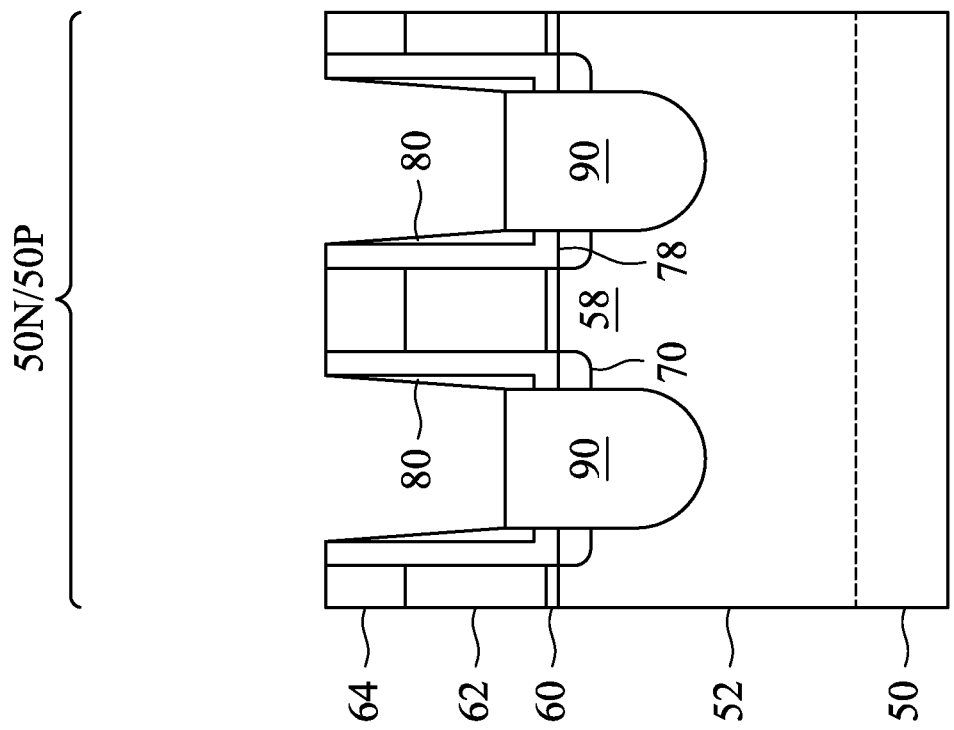

In FIGS. 6A and 6B, epitaxial source/drain regions 90 are formed in the source/drain recesses 76 to exert stress in the respective channel regions 58, thereby improving performance. The epitaxial source/drain regions 90 are formed in the source/drain recesses 76 such that each dummy gate 62 is disposed between respective neighboring pairs of the epitaxial source/drain regions 90. In some embodiments, the gate spacers 78 and second spacers 80 are used to separate the epitaxial source/drain regions 90 from the dummy gates 62 by an appropriate lateral distance so that the epitaxial source/drain regions 90 do not short out subsequently formed gates of the resulting FinFETs.

The epitaxial source/drain regions 90 in the region 50N, e.g., the NMOS region, may be formed by masking the region 50P, e.g., the PMOS region, and epitaxially growing the epitaxial source/drain regions 90 in the region 50N. The epitaxial source/drain regions 90 may include any acceptable material, such as appropriate for n-type FinFETs. For example, if the fin 52 is silicon, the epitaxial source/drain regions 90 in the region 50N may include materials exerting a tensile strain in the channel region 58, such as silicon, silicon carbide, phosphorous doped silicon carbide, silicon phosphide, or the like. The epitaxial source/drain regions 90 in the region 50N may have surfaces raised from respective surfaces of the fins 52 and may have facets.

The epitaxial source/drain regions 90 in the region 50P, e.g., the PMOS region, may be formed by masking the region 50N, e.g., the NMOS region, and epitaxially growing the epitaxial source/drain regions 90 in the region 50P. The epitaxial source/drain regions 90 may include any acceptable material, such as appropriate for p-type FinFETs. For example, if the fin 52 is silicon, the epitaxial source/drain regions 90 in the region 50P may comprise materials exerting a compressive strain in the channel region 58, such as silicon-germanium, boron doped silicon-germanium, germanium, germanium tin, or the like. The epitaxial source/drain regions 90 in the region 50P may also have surfaces raised from respective surfaces of the fins 52 and may have facets.

The epitaxial source/drain regions 90 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 90 may be in situ doped during growth.

Figure 6C:
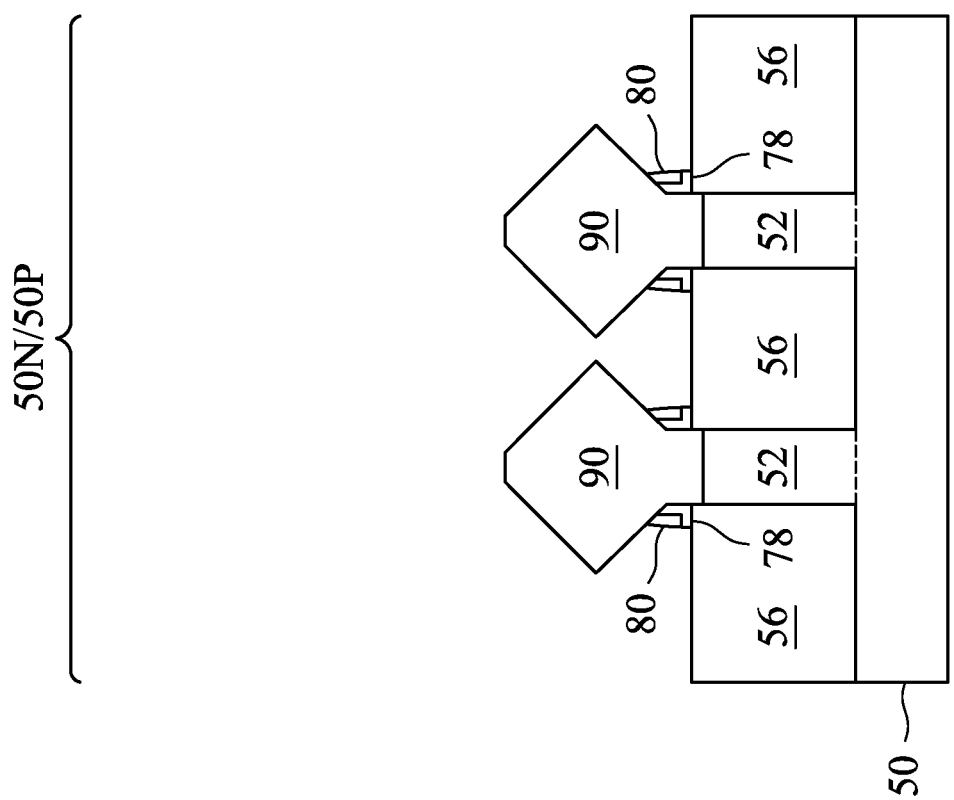

As a result of the epitaxy processes used to form the epitaxial source/drain regions 90 in the region 50N and the region 50P, upper surfaces of the epitaxial source/drain regions have facets which expand laterally outward beyond sidewalls of the fins 52. In some embodiments, these facets cause adjacent epitaxial source/drain regions 90 of a same FinFET to merge as illustrated by FIG. 6B. In other embodiments, adjacent epitaxial source/drain regions 90 remain separated after the epitaxy process is completed as illustrated by FIG. 6C. In the embodiments illustrated in FIGS. 6B and 6C, the gate spacers 78 and second spacers 80 are formed covering a portion of the sidewalls of the fins 52 that extend above the STI regions 56 thereby blocking the epitaxial growth. In some other embodiments, the etch used to form the source/drain recesses 76 may be adjusted to remove the spacer material to allow the epitaxially grown region to extend to the surface of the STI region 56.

The ordering of operations can be modified. In some embodiments, the source/drain recesses 76 can be patterned separately in each of the regions 50P and 50N. For example, the source/drain recesses 76 and epitaxial source/drain regions 90 can both be formed in the region 50N while the region 50P is masked, and the source/drain recesses 76 and epitaxial source/drain regions 90 can both be formed in the region 50P while the region 50N is masked. In some embodiments, a single spacer layer 74 is formed in both regions 50P and 50N, and the single spacer layer 74 is patterned in each of the regions 50P and 50N. In some embodiments, a spacer layer 74 is separately formed and patterned in each region 50P/50N while the corresponding other region 50N/50P is masked.

Figure 7A:
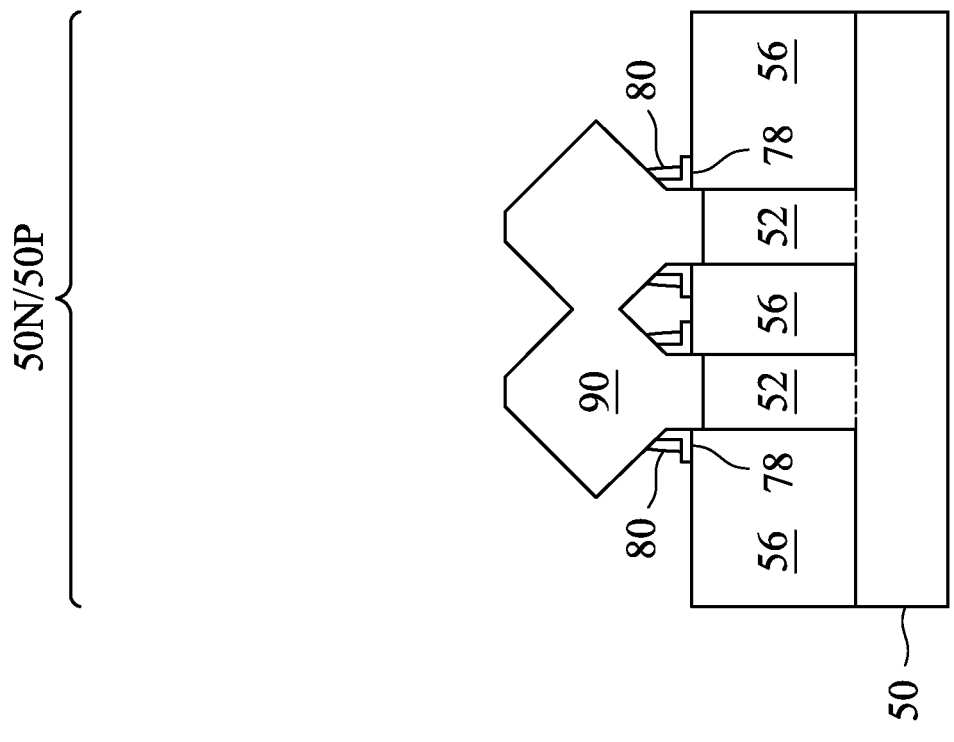
Figure 7B:
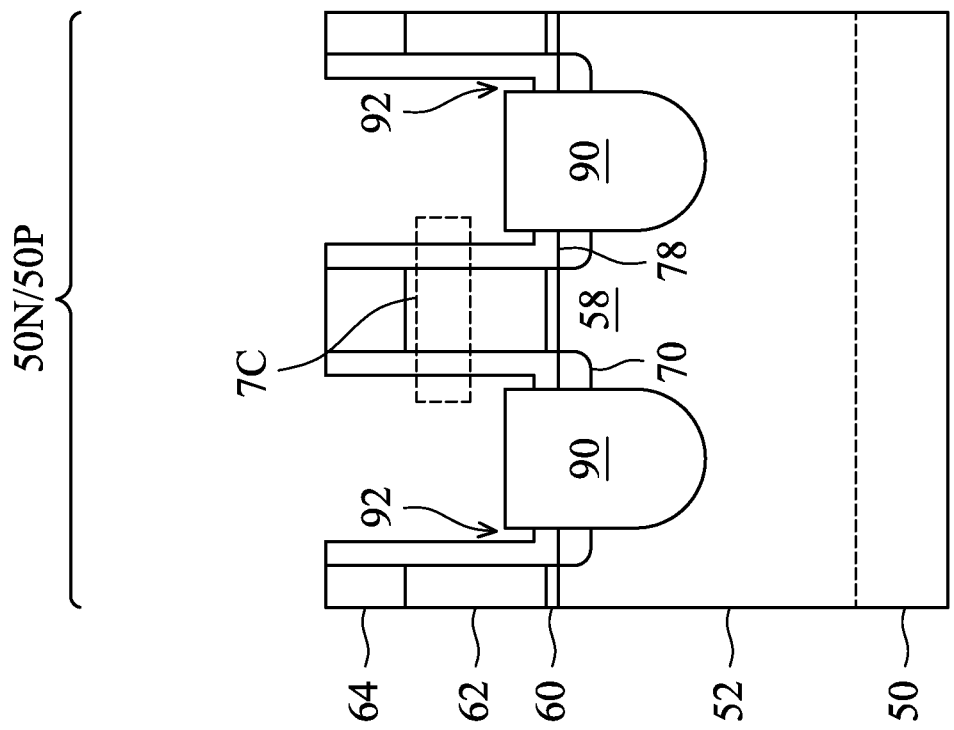

In FIGS. 7A and 7B, the second spacers 80 are optionally removed. FIG. 7C is a detailed view of a region 7C of FIG. 7A, showing more details of the gate spacers 78, and is described concurrently with FIGS. 7A and 7B. Removal may be by an appropriate etching process. In some embodiments, an anisotropic wet etch is performed with a phosphoric acid solution (H$_3$PO$_4$:H$_2$O) to remove the second spacers 80. As noted above, the protective layer 72D has a high etch selectivity with the spacer layer 74, relative a wet etch with phosphoric acid, thus protecting the other gate spacer layers 72A, 72B, and 72C during the wet etch. After removal, recesses 92 can be formed between the epitaxial source/drain regions 90 and sidewalls of the gate spacers 78. In some embodiments, the wet etch only removes some portions of the second spacers 80, such as portions disposed between the dummy gates 62 and epitaxial source/drain regions 90, and residual portions of the second spacers 80 may remain beneath the epitaxial source/drain regions 90. In other words, after the wet etch, first portions of the gate spacers 78 (e.g., portions on the top surfaces of the fins 52) are free from the second spacers 80, and second portions of the gate spacers 78 (e.g., portions on sidewalls of the fins 52 and top surfaces of the STI regions 56) are covered by the second spacers 80.

Figure 8B:
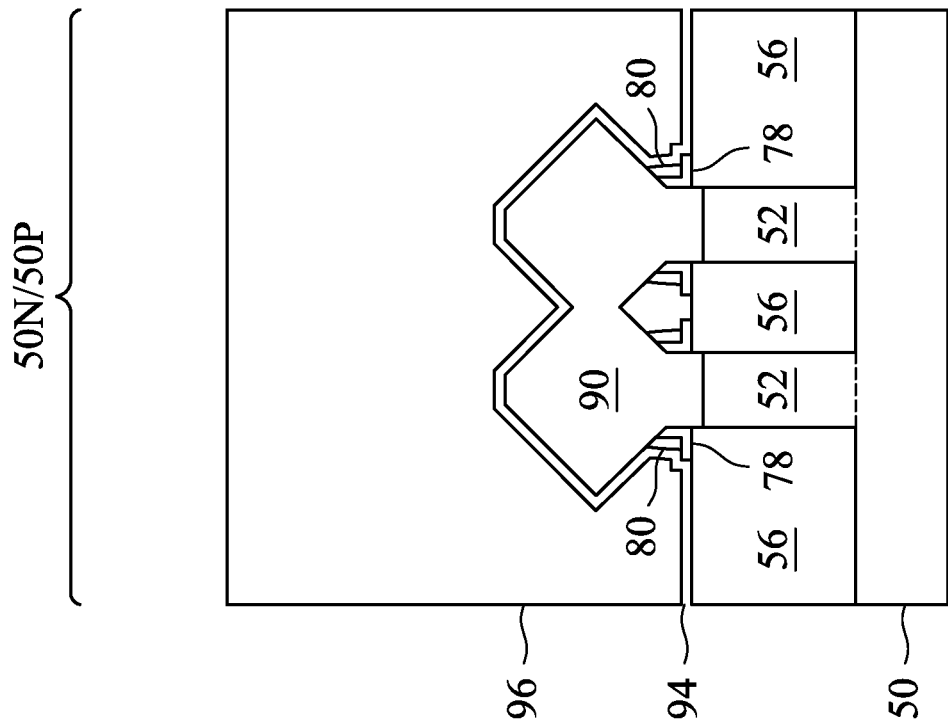
Figure 8A:
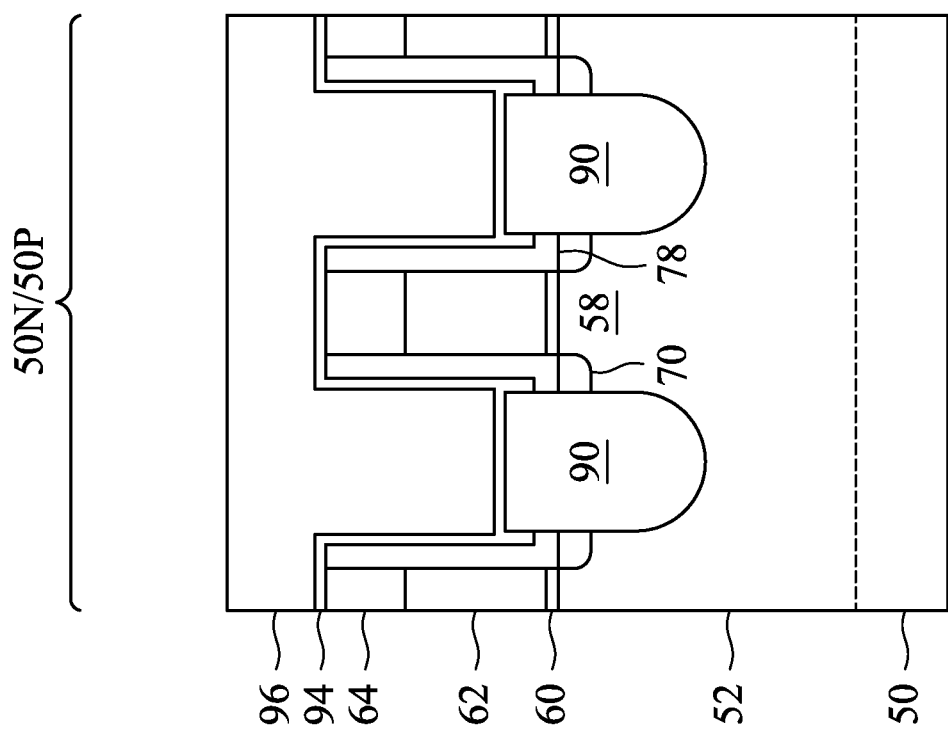

In FIGS. 8A and 8B, a first ILD layer 96 is deposited over the intermediate structure. The first ILD layer 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 94 is disposed between the first ILD layer 96 and the epitaxial source/drain regions 90, the masks 64, and the gate spacers 78. The CESL 94 may comprise a dielectric material, such as, silicon nitride, silicon oxide, silicon oxynitride, or the like, and may be formed by a deposition process such as chemical vapor deposition (CVD), plasma enhanced chemical vapor deposition (PECVD), atomic layer deposition (ALD), or the like. The CESL 94 has a different etch rate than the materials of the first ILD layer 96 and gate spacers 78. In some embodiments, the CESL 94 comprises a different dielectric material than each layer of the gate spacers 78, and can have a higher relative permittivity than at least some of the layers (e.g., the second main layer 72C) of the gate spacers 78. For example, the CESL 94 can be formed from silicon nitride. The CESL 94 physically contacts sidewalls of the gate spacers 78, and any residual portions of the second spacers 80. When the recesses 92 are formed, the CESL 94 can also be formed in the recesses 92. Notably, the residual portions of the second spacers 80 are disposed between sidewalls of the CESL 94 and the gate spacers 78. The residual portions of the second spacers 80 can thus be referred to as source/drain sidewall spacers.

Figure 9A:
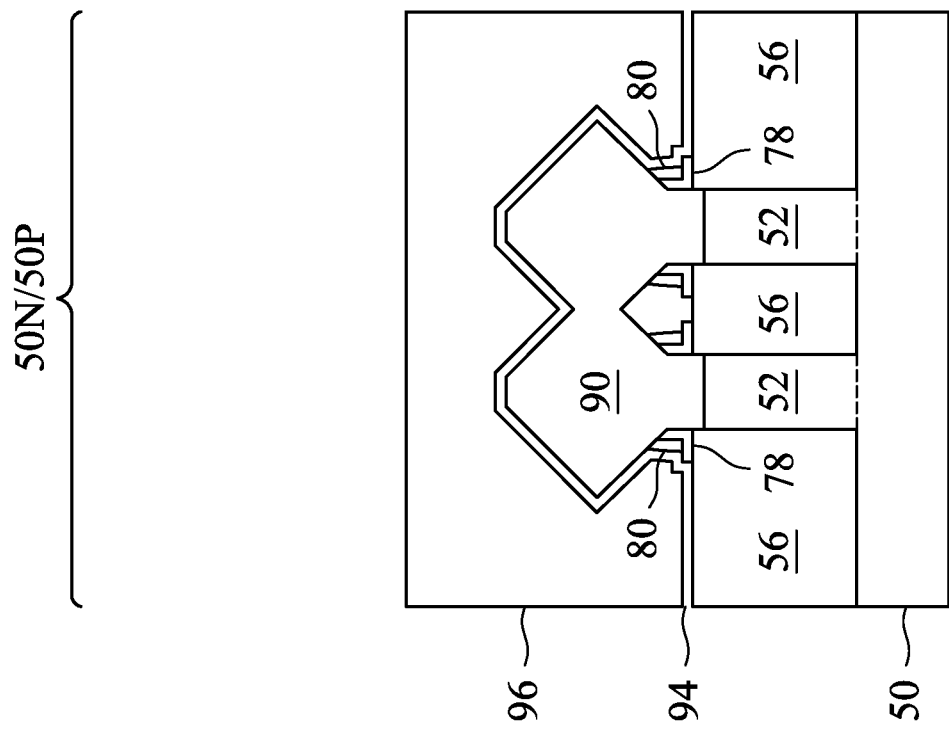
Figure 9B:
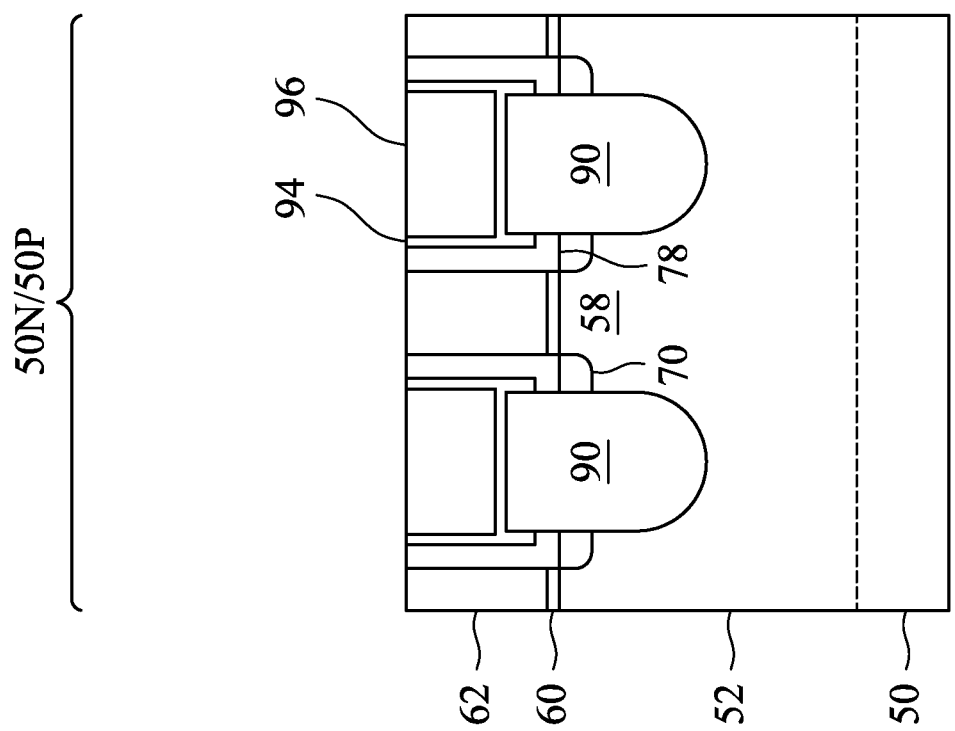

In FIGS. 9A and 9B, a planarization process, such as a CMP, may be performed to level the top surface of the first ILD layer 96 with the top surfaces of the dummy gates 62 or the masks 64. The planarization process may also remove the masks 64 on the dummy gates 62, and portions of the gate spacers 78 along sidewalls of the masks 64. After the planarization process, top surfaces of the dummy gates 62, gate spacers 78, and the first ILD layer 96 are level. Accordingly, the top surfaces of the dummy gates 62 are exposed through the first ILD layer 96. In some embodiments, the masks 64 may remain, in which case the planarization process levels the top surface of the first ILD layer 96 with the top surfaces of the masks 64.

Figure 10A:
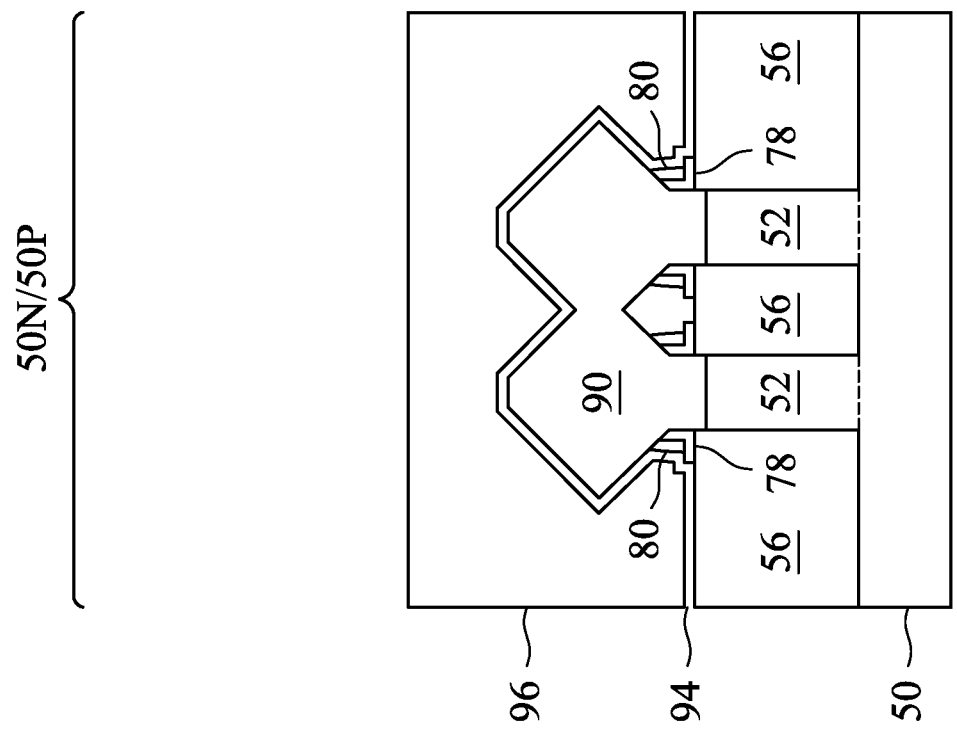
Figure 10B:
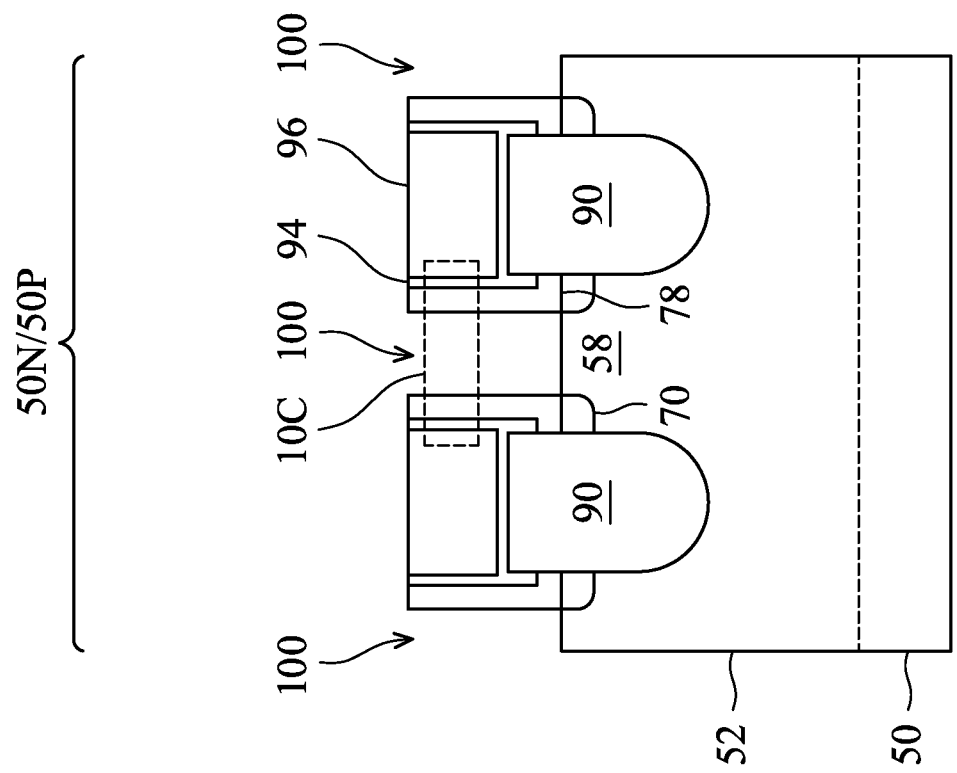
Figure 10C:
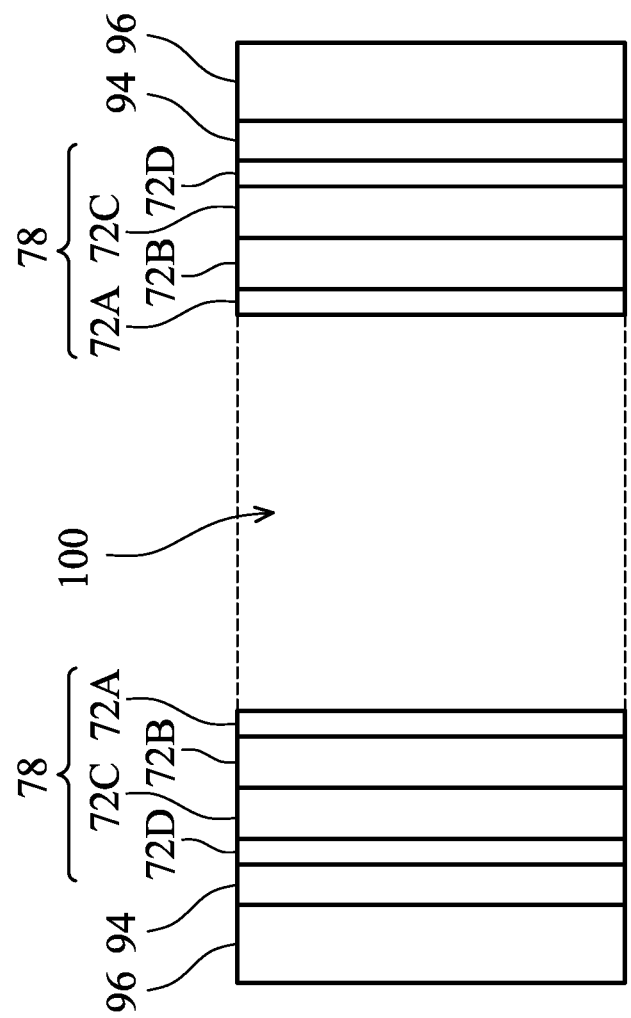

In FIGS. 10A and 10B, the dummy gates 62, and the masks 64 if present, are removed in one or more etching step(s). FIG. 10C is a detailed view of a region 10C of FIG. 10A, showing more details of the gate spacers 78, and is described concurrently with FIGS. 10A and 10B. The removal forms replacement gate recesses 100. Portions of the dummy gate dielectrics 60 in the replacement gate recesses 100 may also be removed. In some embodiments, only the dummy gates 62 are removed and the dummy gate dielectrics 60 remain and are exposed by the replacement gate recesses 100. In some embodiments, the dummy gate dielectrics 60 are removed from replacement gate recesses 100 in a first region of a die (e.g., a core logic region) and remain in replacement gate recesses 100 in a second region of the die (e.g., an input/output region). In some embodiments, the dummy gates 62 are removed by an anisotropic dry etch process. For example, the etching process may include a dry etch process using reaction gas(es) that selectively etch the dummy gates 62 without etching the first ILD layer 96 or the gate spacers 78. Each recess 100 exposes and/or overlies a channel region 58 of a respective fin 52. Each channel region 58 is disposed between neighboring pairs of the epitaxial source/drain regions 90. During the removal, the dummy gate dielectrics 60 may be used as etch stop layers when the dummy gates 62 are etched. The dummy gate dielectrics 60 may then be optionally removed after the removal of the dummy gates 62. In some embodiments, the dummy gate dielectrics 60 are removed by an anisotropic wet etch process. For example, the wet etch can be performed with a dilute hydrofluoric (dHF) acid solution ($HF:H_2O$). The temperature of the dilute hydrofluoric acid solution may be in the range of about 20° C. to about 100° C. As noted above, the first protective layer 72A has a composition that includes additional nitrogen. The wet etch removes the material of the dummy gate dielectrics 60 at a higher rate than the nitrogen-rich material of the first protective layer 72A. For example, the etch rate of the dummy gate dielectrics 60 is from about 1.1 to about 2 times greater than the etch rate of the first protective layer 72A relative the wet etch. In other words, the first protective layer 72A acts as a protective layer during the wet etch.

Figure 11B:
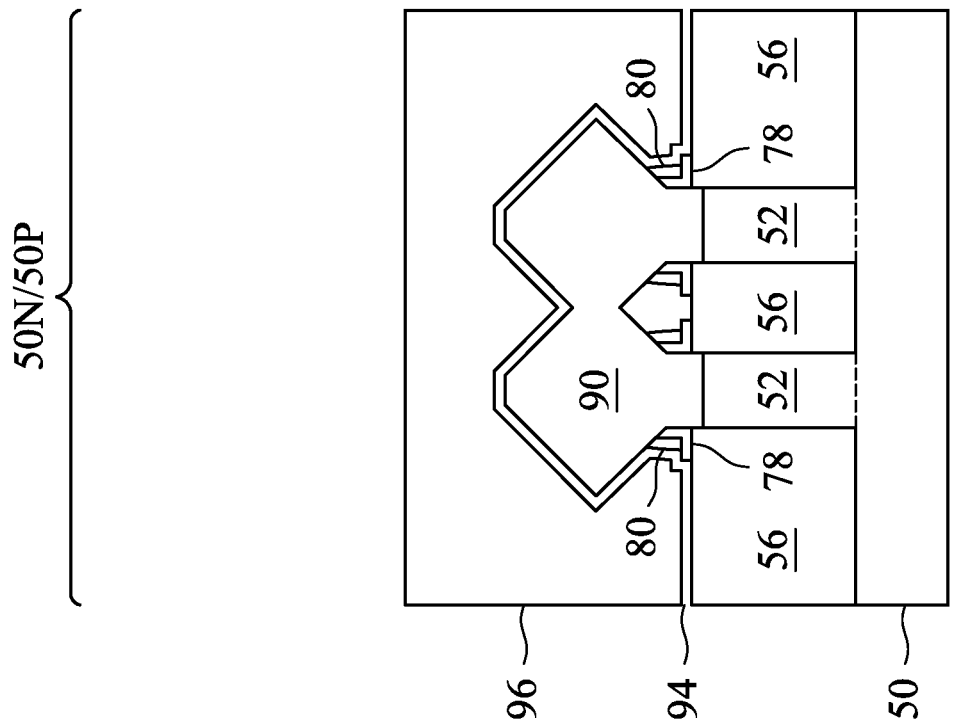
Figure 11A:
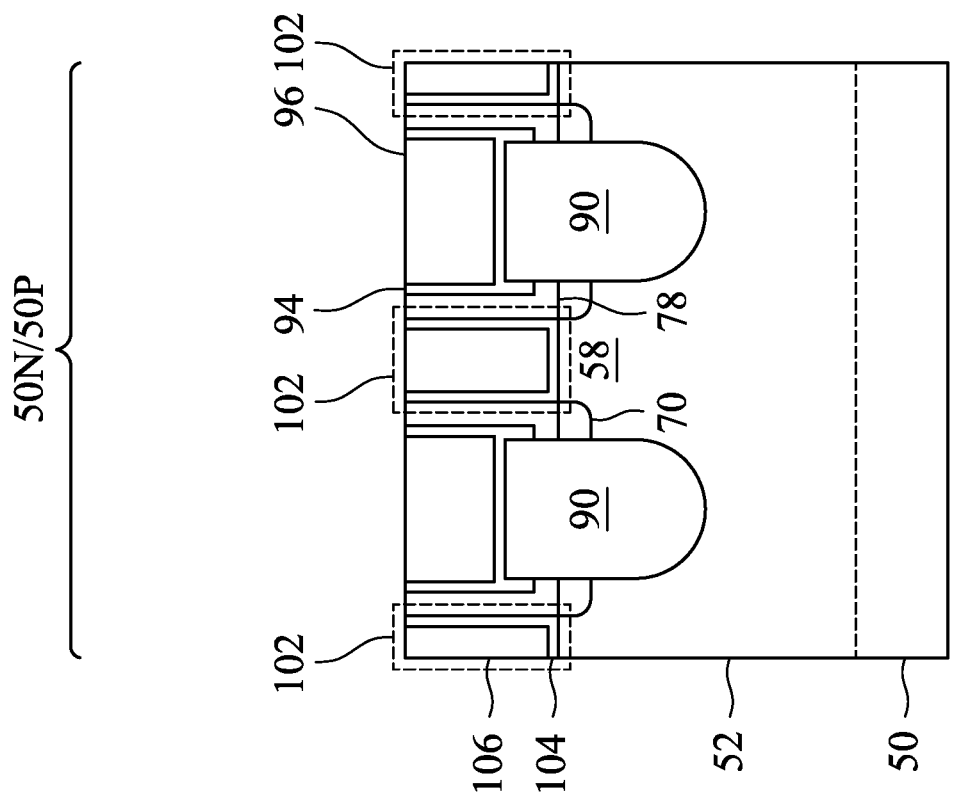

In FIGS. 11A and 11B, metal gates 102 are formed in the replacement gate recesses 100. The metal gates 102 include gate dielectrics 104 and gate electrodes 106. The gate dielectrics 104 are deposited conformally in the recesses, such as on the top surfaces and the sidewalls of the fins 52 and on sidewalls of the gate spacers 78. The gate dielectrics 104 may also be formed on top surface of the first ILD layer 96. In accordance with some embodiments, the gate dielectrics 104 comprise silicon oxide, silicon nitride, or multi-layers thereof. In some embodiments, the gate dielectrics 104 include a high-k dielectric material, and in these embodiments, the gate dielectrics 104 may have a k value greater than about 7.0, and may include a metal oxide or a silicate of Hf, Al, Zr, La, Mg, Ba, Ti, Pb, and combinations thereof. The formation methods of the gate dielectrics 104 may include Molecular-Beam Deposition (MBD), atomic layer deposition (ALD), PECVD, and the like. In embodiments where portions of the dummy gate dielectrics 60 remain in the recesses, the gate dielectrics 104 include a material of the dummy gate dielectrics 60 (e.g., SiO2).

The gate electrodes 106 are deposited over the gate dielectrics 104, respectively, and fill the remaining portions of the recesses. The gate electrodes 106 may include a metal-containing material such as TiN, TiO, TaN, TaC, Co, Ru, Al, W, combinations thereof, or multi-layers thereof. For example, although a single-layered gate electrode 106 is illustrated, each gate electrode 106 may comprise any number of liner layers, any number of work function tuning layers, and a fill material. After the filling of the gate electrodes 106, a planarization process, such as a CMP, may be performed to remove the excess portions of the gate dielectrics 104 and the material of the gate electrodes 106, which excess portions are over the top surface of the first ILD layer 96. The remaining portions of material of the gate electrodes 106 and the gate dielectrics 104 thus form the metal gates 102. The metal gates 102 may be also referred to as "gate stacks" or "replacement gate stacks" for the resulting FinFETs. The metal gates 102 may extend along sidewalls of a channel region 58 of the fins 52.

The formation of the gate dielectrics 104 in the region 50N and the region 50P may occur simultaneously such that the gate dielectrics 104 in each region are formed from the same materials, and the formation of the gate electrodes 106 may occur simultaneously such that the gate electrodes 106 in each region are formed from the same materials. In some embodiments, the gate dielectrics 104 in each region may be formed by distinct processes, such that the gate dielectrics 104 may be different materials, and/or the gate electrodes 106 in each region may be formed by distinct processes, such that the gate electrodes 106 may be different materials. Various masking steps may be used to mask and expose appropriate regions when using distinct processes.

Figure 12B:
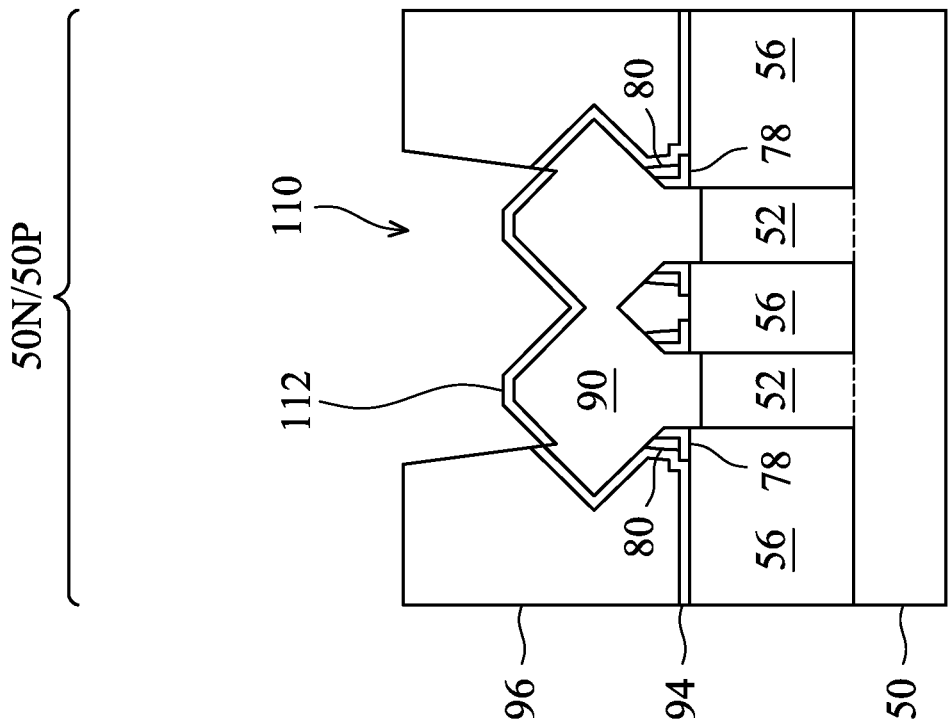
Figure 12A:
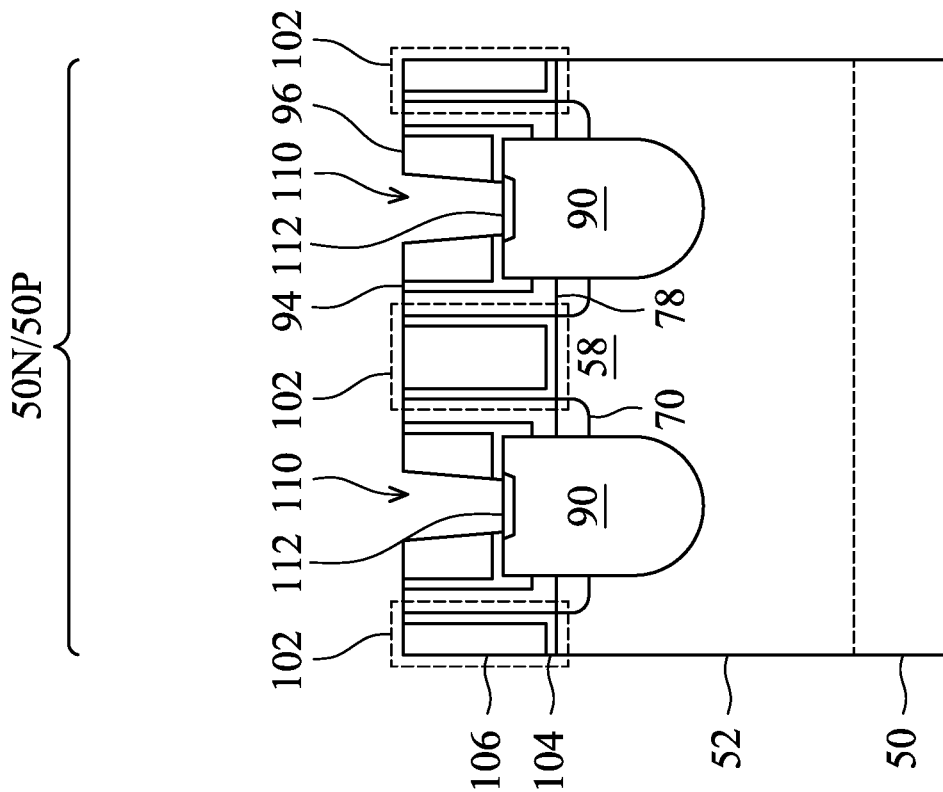

In FIGS. 12A and 12B, contact openings 110 are formed through the first ILD layer 96 and CESL 94, exposing the epitaxial source/drain regions 90. The contact openings 110 may be formed using acceptable photolithography and etching techniques. Silicides 112 are then formed in the contact openings 110, on portions of the epitaxial source/drain regions 90 exposed by the contact openings 110. The silicides 112 can be formed by depositing a metal in the contact openings 110 and performing an anneal. The metal, can be, e.g., titanium or cobalt, which respectively, can form the silicides 112 of $TiSi_2$ or $CoSi_2$. The silicides 112 can have a thickness in the range of about 2 nm to about 10 nm.

Figure 13B:
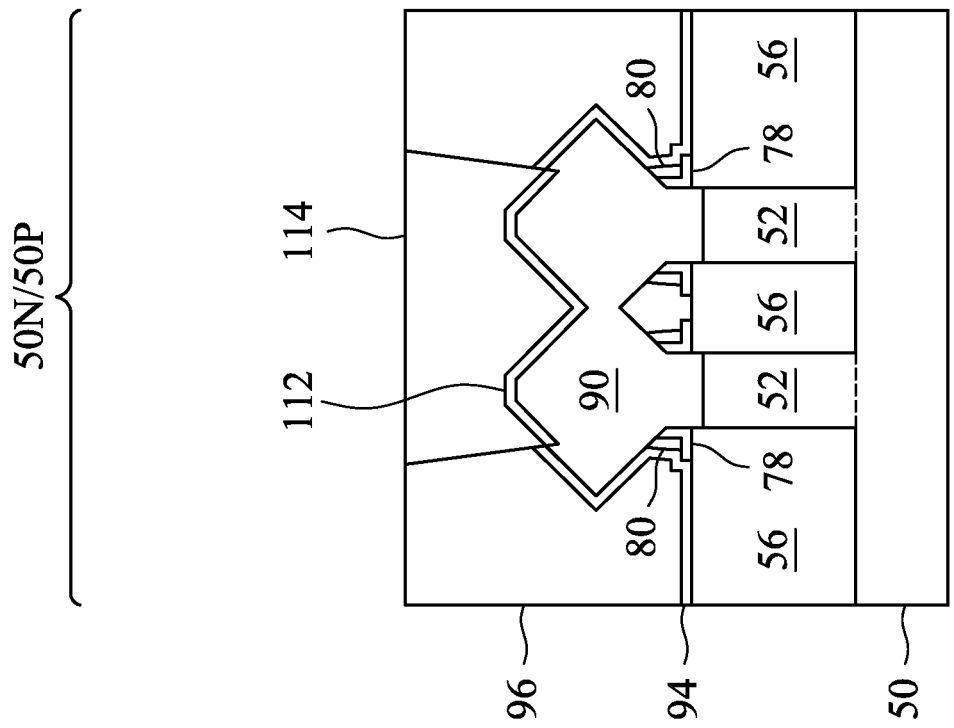
Figure 13A:
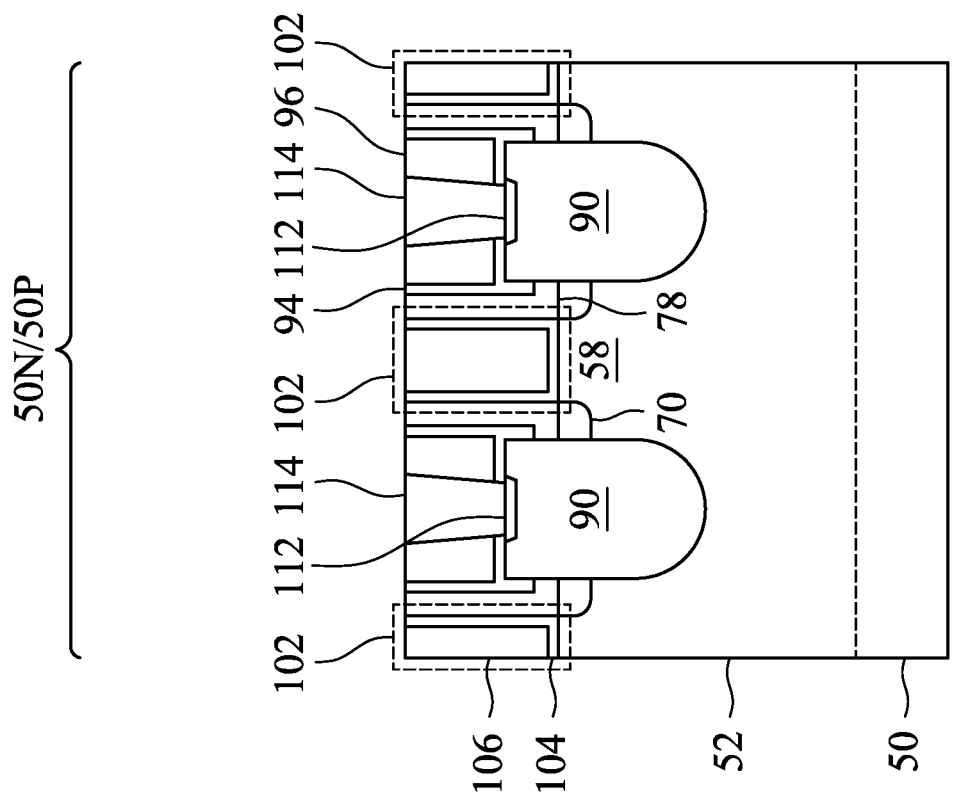

In FIGS. 13A and 13B, lower source/drain contacts 114 are formed in the contact openings 110 (see FIGS. 12A and 12B). A liner, such as a diffusion barrier layer, an adhesion layer, or the like, and a conductive material are formed in the contact openings 110, on the silicides 112. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD layer 96. The remaining liner and conductive material form the lower source/drain contacts 114 in the contact openings 110. The lower source/drain contacts 114 are physically and electrically coupled to the silicides 112. The lower source/drain contacts 114 can have a height in the range of about 5 nm to about 15 nm.

Figure 14A:
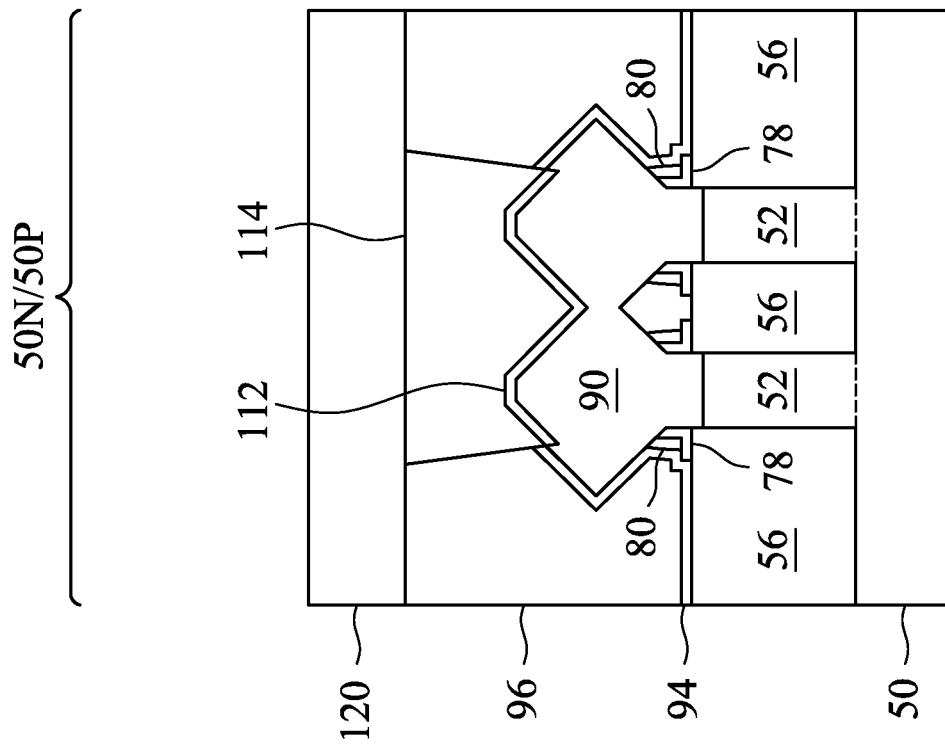
Figure 14B:
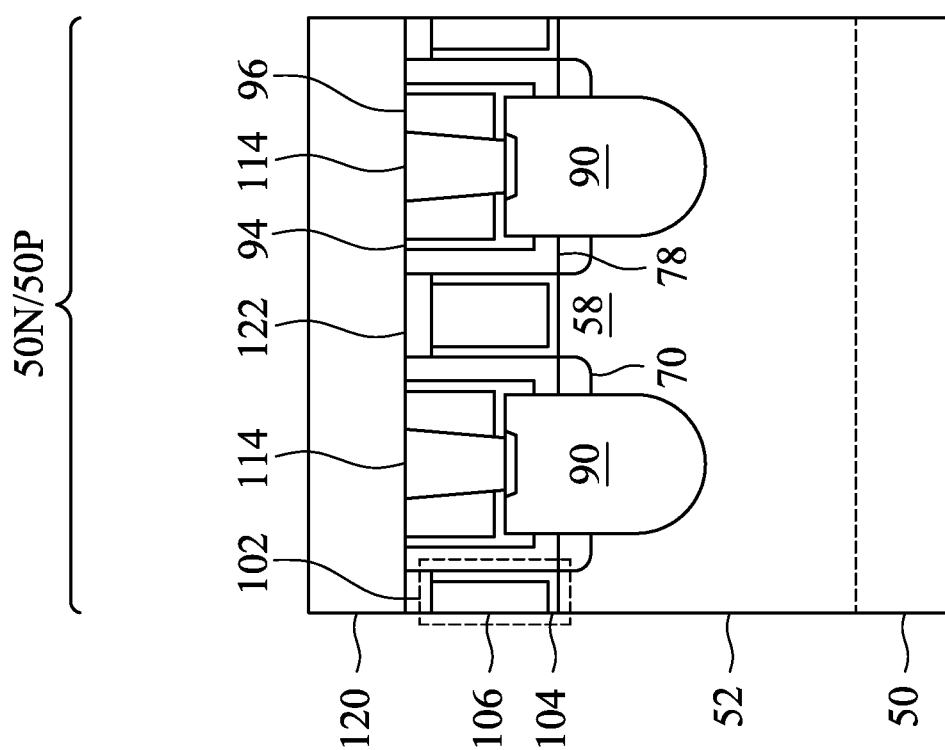

In FIGS. 14A and 14B, a second ILD layer 120 is deposited over the first ILD layer 96 and lower source/drain contacts 114. In some embodiment, the second ILD layer 120 is a flowable film formed by a flowable CVD method. In some embodiments, the second ILD layer 120 is formed of a dielectric material such as PSG, BSG, BPSG, USG, or the like, and may be deposited by any suitable method, such as CVD and PECVD. In accordance with some embodiments, before the formation of the second ILD layer 120, the metal gates 102 can be recessed, so that recesses are formed directly over the metal gates 102 and between opposing portions of the gate spacers 78. Gate masks 122 comprising one or more layers of dielectric material, such as silicon nitride, silicon oxynitride, or the like, are filled in the recesses, followed by a planarization process to remove excess portions of the dielectric material extending over the first ILD layer 96.

Figure 15B:
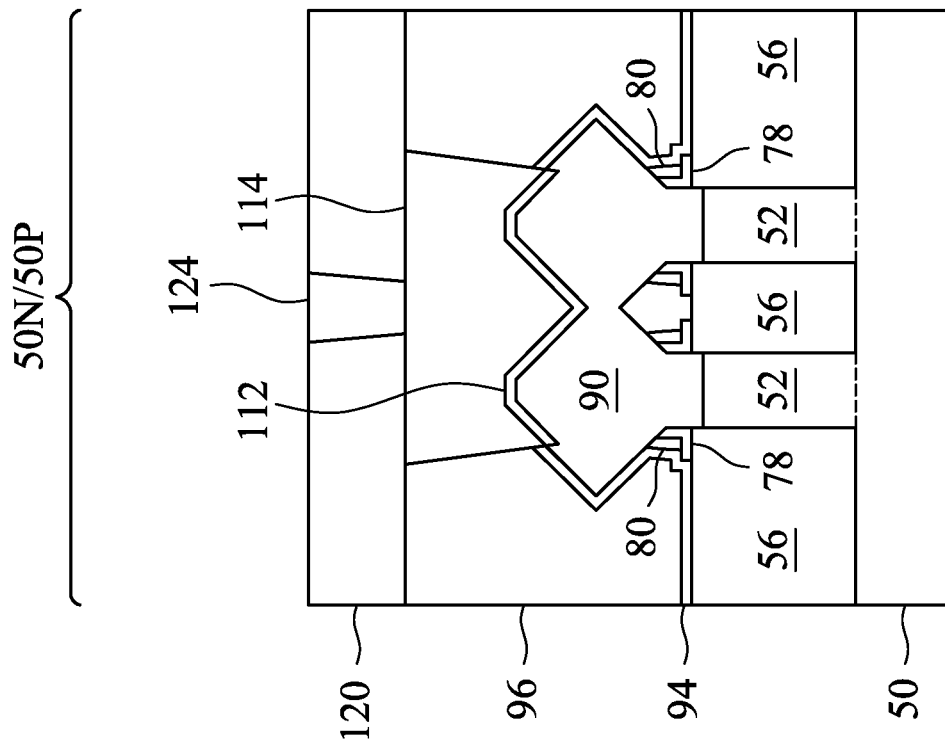
Figure 15A:
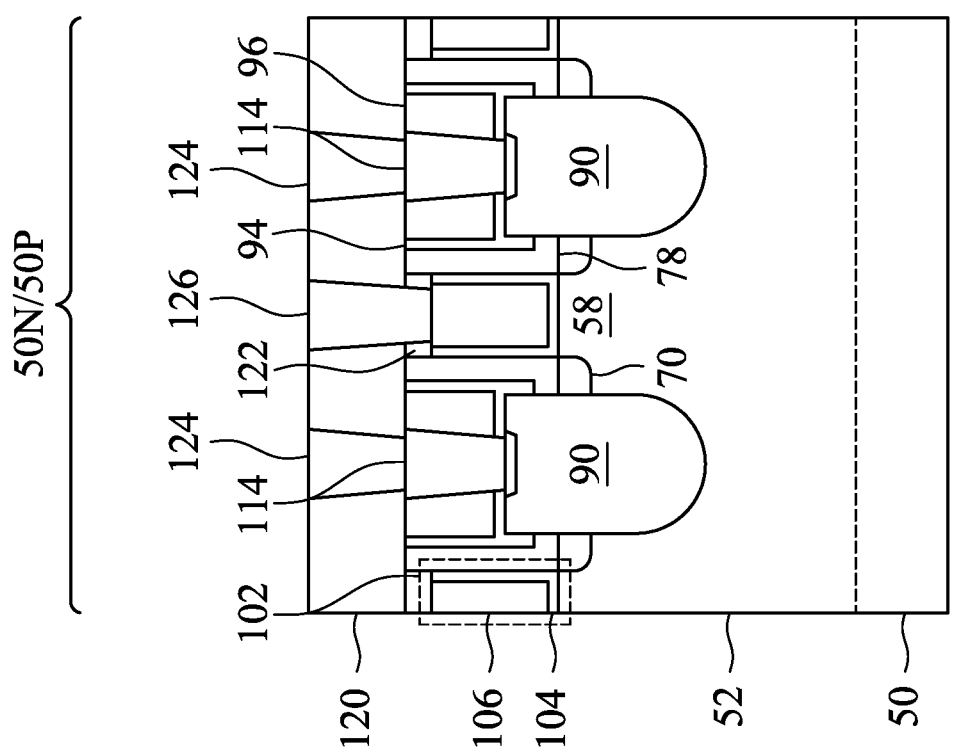

In FIGS. 15A and 15B, upper source/drain contacts 124 and gate contacts 126 are then formed through the second ILD layer 120. Openings for the upper source/drain contacts 124 and gate contacts 126 are formed through the second ILD layer 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 120. The remaining liner and conductive material form the upper source/drain contacts 124 and gate contacts 126 in the openings. The upper source/drain contacts 124 are physically and electrically coupled to the lower source/drain contacts 114, and the gate contacts 126 are physically and electrically coupled to the metal gates 102. The gate contacts 126 can penetrate through the gate masks 122, if present. The upper source/drain contacts 124 and gate contacts 126 may be formed in different processes, or may be formed in the same process. Each of the upper source/drain contacts 124 and gate contacts 126 may be formed in different cross-sections, which may avoid shorting of the contacts.

Embodiments may achieve advantages. Forming the gate spacer layers 72 with different composition of silicon, oxygen, carbon, and nitrogen allows the gate spacer layers 72 to have a high etch selectivity, relative to the etching processes that are used to form the source/drain recesses 76 (see FIGS. 5A and 5B) and the replacement gate recesses 100 (see FIGS. 10A and 10B). Specifically, the first protective layer 72A and second protective layer 72D protect the first main layer 72B and second main layer 72C from etching, thus reducing etching losses for the gate spacer layers 72. Loss of the gate spacer layers 72 may thus be reduced, thus decreasing the relative permittivity of the gate spacers 78. The parasitic capacitance of the resulting FinFETs may thus be decreased, which can be particularly advantageous for some application, such as ring oscillators or SRAM cells.

Figure 16:
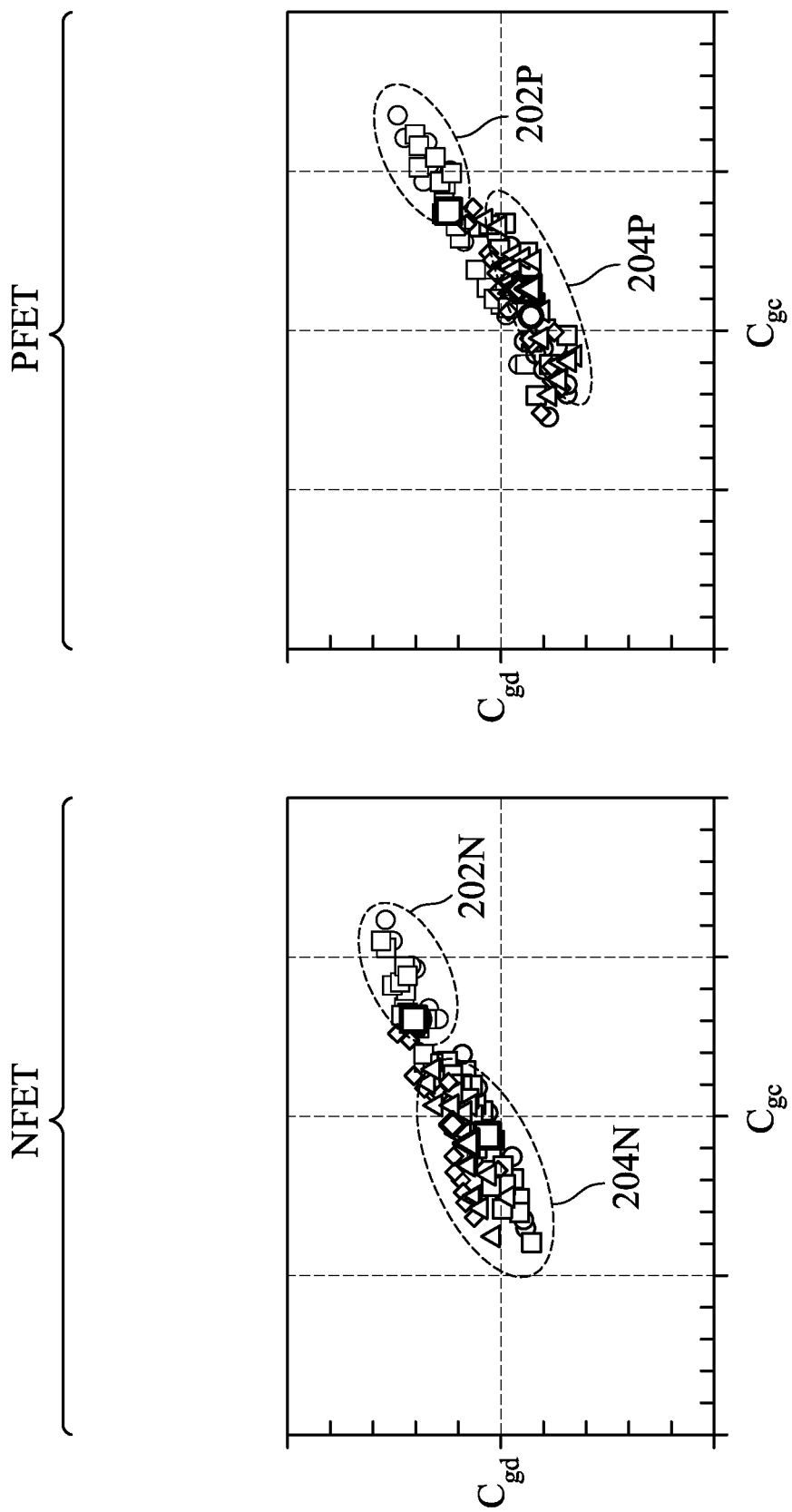
FIG. 16 shows scatter plots of test data for n-type FinFET (NFET) devices and p-type FinFET (PFET) devices.

FIG. 16 shows scatter plots of test data for n-type FinFET (NFET) devices and p-type FinFET (PFET) devices. FIG. 16 shows test data 202N, 202P for FinFETs without embodiment gate spacers, and also shows test data 204N, 204P for FinFETs with embodiment gate spacers. As shown, embodiment gate spacers allow both the gate-to-channel capacitance ($C_{gc}$) and the gate-to-drain/source capacitance ($C_{gd}$) to be decreased. Embodiments may allow the parasitic capacitance to be decreased by as much as 5%.

In an embodiment, a structure includes: a semiconductor substrate; a fin extending from the semiconductor substrate; a gate stack over the fin; an epitaxial source/drain region in the fin adjacent the gate stack; and a gate spacer disposed between the epitaxial source/drain region and the gate stack, the gate spacer including a plurality of silicon oxycarbonitride layers, each of the plurality of silicon oxycarbonitride layers having a different concentration of silicon, a different concentration of oxygen, a different concentration of carbon, and a different concentration of nitrogen. In some embodiments of the structure, the plurality of silicon oxycarbonitride layers includes: a first dielectric layer contacting the gate stack; a second dielectric layer contacting the first dielectric layer, the second dielectric layer being from 1.5 to 6 times thicker than the first dielectric layer; a third dielectric layer contacting the second dielectric layer, the third dielectric layer being from 1.5 to 6 times thicker than the first dielectric layer; and a fourth dielectric layer contacting the third dielectric layer, the third dielectric layer being from 1.5 to 6 times thicker than the fourth dielectric layer, the second dielectric layer being from 1.5 to 6 times thicker than the fourth dielectric layer. In some embodiments of the structure, the first dielectric layer has a concentration of nitrogen that is from 1.1 to 4 times greater than the second dielectric layer, the third dielectric layer, and the fourth dielectric layer. In some embodiments of the structure, the third dielectric layer has a concentration of oxygen that is from 1.2 to 3 times greater than the first dielectric layer, the second dielectric layer, and the fourth dielectric layer. In some embodiments of the structure, the fourth dielectric layer has a concentration of carbon that is from 1.5 to 30 times greater than the second dielectric layer and the third dielectric layer. In some embodiments of the structure, the third dielectric layer has a relative permittivity that is from 10% to 40% less than the first dielectric layer, the second dielectric layer, and the fourth dielectric layer. In some embodiments, the structure further includes: an isolation region surrounding the fin, the gate spacer having a first portion and a second portion, the first portion disposed on a top surface of the fin, the second portion disposed on a sidewall of the fin and a top surface of the isolation region; and a sidewall spacer on the second portion of the gate spacer, the first portion of the gate spacer being free from the sidewall spacer. In some embodiments, the structure further includes: a contact etch stop layer (CESL) on the epitaxial source/drain region, the CESL contacting sidewalls of the first portion of the gate spacer, the sidewall spacer disposed between the CESL and the second portion of the gate spacer.

In an embodiment, a structure includes: a semiconductor substrate including a channel region; a gate stack over the channel region; an epitaxial source/drain region adjacent the channel region; and a gate spacer disposed between the epitaxial source/drain region and the gate stack, the gate spacer including: a first protective layer over the semiconductor substrate; a first main layer disposed over the first protective layer; a second main layer disposed over the first main layer; and a second protective layer disposed over the second main layer, where the second main layer has a lesser relative permittivity than each of the first protective layer, the first main layer, and the second protective layer, and where the first protective layer has a lesser etch rate than each of the first main layer, the second main layer, and the second protective layer relative an etching process. In some embodiments of the structure, each of the first main layer and the second main layer has a thickness that is from 1.5 to 6 times greater than each of the first protective layer and the second protective layer. In some embodiments of the structure, each of the first protective layer, the first main layer, the second main layer, and the second protective layer include a different composition of silicon oxycarbonitride, and further including: a contact etch stop layer (CESL) disposed over the epitaxial source/drain region and along a sidewall of the gate spacer, the CESL including silicon nitride.

In an embodiment, a method includes: forming a first gate stack on a fin; dispensing first precursors to deposit a first silicon oxycarbonitride layer and a second silicon oxycarbonitride layer, the first silicon oxycarbonitride layer being on sidewalls and a top surface of the first gate stack and the fin, the second silicon oxycarbonitride layer being on the first silicon oxycarbonitride layer, the first precursors being dispensed at a first set of flow rates when depositing the first silicon oxycarbonitride layer, the first precursors being dispensed at a second set of flow rates when depositing the second silicon oxycarbonitride layer, the first set of flow rates being different from the second set of flow rates; and dispensing second precursors to deposit a third silicon oxycarbonitride layer and a fourth silicon oxycarbonitride layer, the third silicon oxycarbonitride layer being on the second silicon oxycarbonitride layer, the fourth silicon oxycarbonitride layer being on the third silicon oxycarbonitride layer, the second precursors being dispensed at a third set of flow rates when depositing the third silicon oxycarbonitride layer, the second precursors being dispensed at a fourth set of flow rates when depositing the fourth silicon oxycarbonitride layer, the third set of flow rates being different from the fourth set of flow rates.

In some embodiments of the method, the first precursors include a silicon source precursor, an oxygen source precursor, a carbon source precursor, and a nitrogen source precursor, and the second precursors include the silicon source precursor, the oxygen source precursor, and a carbon-nitrogen source precursor. In some embodiments of the method, the oxygen source precursor is dispensed at a first rate when depositing the first silicon oxycarbonitride layer and at a second rate when depositing the second silicon oxycarbonitride layer, the second rate being from 5% to 70% greater than the first rate, where the carbon source precursor is dispensed at a third rate when depositing the first silicon oxycarbonitride layer and at a fourth rate when depositing the second silicon oxycarbonitride layer, the fourth rate being from 5% to 70% less than the third rate, and where the nitrogen source precursor is dispensed at a fifth rate when depositing the first silicon oxycarbonitride layer and a sixth rate when depositing the second silicon oxycarbonitride layer, the sixth rate being from 5% to 70% less than the fifth rate. In some embodiments of the method, the oxygen source precursor is dispensed at a first rate when depositing the third silicon oxycarbonitride layer and a second rate when depositing the fourth silicon oxycarbonitride layer, the second rate being from 20% to 90% less than the first rate, and where the carbon-nitrogen source precursor is dispensed at a third rate when depositing the third silicon oxycarbonitride layer and a fourth rate when depositing the fourth silicon oxycarbonitride layer, the fourth rate being from 20% to 90% greater than the third rate. In some embodiments of the method, the silicon source precursor is hexachlorodisilane, the oxygen source precursor is dioxygen, the carbon source precursor is propylene, the nitrogen source precursor is ammonia, and the carbon-nitrogen source precursor is triethylamine. In some embodiments, the method further includes: annealing the third silicon oxycarbonitride layer and the fourth silicon oxycarbonitride layer in an oxygen-containing environment, the annealing being performed at a temperature in a range of 600° C. to 750° C. and for a duration in a range of 30 minutes to 180 minutes. In some embodiments of the method, each of the first silicon oxycarbonitride layer and the fourth silicon oxycarbonitride layer has a lesser thickness than each of the second silicon oxycarbonitride layer and the third silicon oxycarbonitride layer. In some embodiments, the method further includes: depositing a sacrificial layer on the fourth silicon oxycarbonitride layer; etching a first recess in the sacrificial layer, the first silicon oxycarbonitride layer, the second silicon oxycarbonitride layer, the third silicon oxycarbonitride layer, the fourth silicon oxycarbonitride layer, and the fin with a first etching process, an etch rate of the sacrificial layer being greater than an etch rate of the fourth silicon oxycarbonitride layer relative the first etching process; growing an epitaxial source/drain region in the first recess; and after growing the epitaxial source/drain region, removing the sacrificial layer. In some embodiments, the method further includes: removing the first gate stack to form a second recess with a second etching process, an etch rate of the first gate stack being greater than an etch rate of the first silicon oxycarbonitride layer the second etching process; and forming a second gate stack in the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate stack on a fin;
   dispensing first precursors to deposit a first silicon oxycarbonitride layer and a second silicon oxycarbonitride layer, the first silicon oxycarbonitride layer being on sidewalls and a top surface of the first gate stack and the fin, the second silicon oxycarbonitride layer being on the first silicon oxycarbonitride layer, the first precursors being dispensed at a first set of flow rates when depositing the first silicon oxycarbonitride layer, the first precursors being dispensed at a second set of flow rates when depositing the second silicon oxycarbonitride layer, the first set of flow rates being different from the second set of flow rates; and
   dispensing second precursors to deposit a third silicon oxycarbonitride layer and a fourth silicon oxycarbonitride layer, the third silicon oxycarbonitride layer being on the second silicon oxycarbonitride layer, the fourth silicon oxycarbonitride layer being on the third silicon oxycarbonitride layer, the second precursors being dispensed at a third set of flow rates when depositing the third silicon oxycarbonitride layer, the second precursors being dispensed at a fourth set of flow rates when depositing the fourth silicon oxycarbonitride layer, the third set of flow rates being different from the fourth set of flow rates.

2. The method of claim 1, wherein the first precursors comprise a silicon source precursor, an oxygen source precursor, a carbon source precursor, and a nitrogen source precursor, and wherein the second precursors comprise the silicon source precursor, the oxygen source precursor, and a carbon-nitrogen source precursor.

3. The method of claim 2, wherein the oxygen source precursor is dispensed at a first rate when depositing the first silicon oxycarbonitride layer and at a second rate when depositing the second silicon oxycarbonitride layer, the second rate being from 5% to 70% greater than the first rate, wherein the carbon source precursor is dispensed at a third rate when depositing the first silicon oxycarbonitride layer and at a fourth rate when depositing the second silicon oxycarbonitride layer, the fourth rate being from 5% to 70% less than the third rate, and wherein the nitrogen source precursor is dispensed at a fifth rate when depositing the first silicon oxycarbonitride layer and a sixth rate when depositing the second silicon oxycarbonitride layer, the sixth rate being from 5% to 70% less than the fifth rate.

4. The method of claim 2, wherein the oxygen source precursor is dispensed at a first rate when depositing the third silicon oxycarbonitride layer and a second rate when depositing the fourth silicon oxycarbonitride layer, the second rate being from 20% to 90% less than the first rate, and wherein the carbon-nitrogen source precursor is dispensed at a third rate when depositing the third silicon oxycarbonitride layer and a fourth rate when depositing the fourth silicon oxycarbonitride layer, the fourth rate being from 20% to 90% greater than the third rate.

5. The method of claim 2, wherein the silicon source precursor is hexachlorodisilane, the oxygen source precursor is dioxygen, the carbon source precursor is propylene, the nitrogen source precursor is ammonia, and the carbon-nitrogen source precursor is triethylamine.

6. The method of claim 1 further comprising:
annealing the third silicon oxycarbonitride layer and the fourth silicon oxycarbonitride layer in an oxygen-containing environment, the annealing being performed at a temperature in a range of 600° C. to 750° C. and for a duration in a range of 30 minutes to 180 minutes.

7. The method of claim 1, wherein each of the first silicon oxycarbonitride layer and the fourth silicon oxycarbonitride layer has a lesser thickness than each of the second silicon oxycarbonitride layer and the third silicon oxycarbonitride layer.

8. The method of claim 1 further comprising:
depositing a sacrificial layer on the fourth silicon oxycarbonitride layer;
etching a first recess in the sacrificial layer, the first silicon oxycarbonitride layer, the second silicon oxycarbonitride layer, the third silicon oxycarbonitride layer, the fourth silicon oxycarbonitride layer, and the fin with a first etching process, an etch rate of the sacrificial layer being greater than an etch rate of the fourth silicon oxycarbonitride layer relative the first etching process;
growing an epitaxial source/drain region in the first recess; and
after growing the epitaxial source/drain region, removing the sacrificial layer.

9. The method of claim 8 further comprising:
removing the first gate stack to form a second recess with a second etching process, an etch rate of the first gate stack being greater than an etch rate of the first silicon oxycarbonitride layer relative the second etching process; and
forming a second gate stack in the second recess.

10. A method comprising:
forming a dummy gate stack on a channel region of a fin;
depositing gate spacer layers comprising a first protective layer on sidewalls of the dummy gate stack and the fin, a main layer on the first protective layer, and a second protective layer on the first protective layer, the main layer having a lesser relative permittivity than each of the first protective layer and the second protective layer;
depositing a sacrificial layer on the gate spacer layers;
etching a first recess in the sacrificial layer, the gate spacer layers, and the fin with a first etching process, the first recess being adjacent the channel region, an etch rate of the sacrificial layer being greater than an etch rate of the second protective layer relative the first etching process;
growing an epitaxial source/drain region in the first recess;
removing the dummy gate stack to form a second recess with a second etching process, an etch rate of the dummy gate stack being greater than an etch rate of the first protective layer relative the second etching process; and
forming a metal gate stack in the second recess.

11. The method of claim 10, wherein the first etching process comprises:
etching the first recess in the sacrificial layer with a wet etch, an etch rate of the sacrificial layer being greater than an etch rate of the second protective layer relative the wet etch, wherein the second protective layer comprises more carbon than the main layer, and the wet etch is performed with a phosphoric acid solution; and
extending the first recess into the gate spacer layers and the fin with a dry etch.

12. The method of claim 10, wherein the dummy gate stack comprises a dummy gate dielectric on the fin, and wherein the second etching process comprises:
etching the dummy gate dielectric with a wet etch, an etch rate of the dummy gate dielectric being greater than an etch rate of the first protective layer relative the wet etch, wherein the first protective layer comprises more nitrogen than the main layer, and the wet etch is performed with a dilute hydrofluoric acid solution.

13. The method of claim 10, wherein the first etching process damages the sacrificial layer, and further comprising:
after growing the epitaxial source/drain region, removing the damaged sacrificial layer.

14. The method of claim 10, wherein the main layer has a greater thickness than each of the first protective layer and the second protective layer.

15. A method comprising:
forming a gate stack on a channel region of a fin;
depositing gate spacer layers on a sidewall of the gate stack and on the fin, the gate spacer layers each comprising silicon oxycarbonitride having a different concentration of silicon, a different concentration of oxygen, a different concentration of carbon, and a different concentration of nitrogen than others of the gate spacer layers;
patterning the gate spacer layers to form a gate spacer on the sidewall of the gate stack; and
forming a source/drain region in the fin, the source/drain region adjacent the gate spacer and the channel region.

16. The method of claim 15, wherein patterning the gate spacer layers comprises etching a recess in the gate spacer layers and the fin, and wherein forming the source/drain region comprises growing the source/drain region in the recess.

17. The method of claim 15, wherein the gate spacer layers comprise:
a first silicon oxycarbonitride layer contacting the gate stack;
a second silicon oxycarbonitride layer contacting the first silicon oxycarbonitride layer, the second silicon oxycarbonitride layer thicker than the first silicon oxycarbonitride layer;
a third silicon oxycarbonitride layer contacting the second silicon oxycarbonitride layer, the third silicon oxycarbonitride layer thicker than the first silicon oxycarbonitride layer; and
a fourth silicon oxycarbonitride layer contacting the third silicon oxycarbonitride layer, the third silicon oxycarbonitride layer thicker than the fourth silicon oxycarbonitride layer, the second silicon oxycarbonitride layer thicker than the fourth silicon oxycarbonitride layer.

18. The method of claim 17, wherein the first silicon oxycarbonitride layer has a concentration of nitrogen that is greater than the second silicon oxycarbonitride layer and the third silicon oxycarbonitride layer.

19. The method of claim 17, wherein the third silicon oxycarbonitride layer has a concentration of oxygen that is greater than the first silicon oxycarbonitride layer and the fourth silicon oxycarbonitride layer.

20. The method of claim 17, wherein the fourth silicon oxycarbonitride layer has a concentration of carbon that is greater than the second silicon oxycarbonitride layer and the third silicon oxycarbonitride layer.

* * * * *